US009142580B2

(12) United States Patent
Iwata et al.

(10) Patent No.: US 9,142,580 B2
(45) Date of Patent: Sep. 22, 2015

(54) IMAGE PICKUP APPARATUS AND IMAGE PICKUP SYSTEM

(71) Applicant: CANON KABUSHIKI KAISHA, Tokyo (JP)

(72) Inventors: Junji Iwata, Tokyo (JP); Fumihiro Inui, Yokohama (JP); Takanori Watanabe, Yamato (JP); Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 13/961,045

(22) Filed: Aug. 7, 2013

(65) Prior Publication Data

US 2014/0042507 A1 Feb. 13, 2014

(30) Foreign Application Priority Data

Aug. 10, 2012 (JP) .................................. 2012-178277
Aug. 10, 2012 (JP) .................................. 2012-178278

(51) Int. Cl.
*H01L 31/062* (2012.01)
*H01L 27/146* (2006.01)

(52) U.S. Cl.
CPC ...... *H01L 27/14612* (2013.01); *H01L 27/1461* (2013.01); *H01L 27/1463* (2013.01); *H01L 27/1464* (2013.01); *H01L 27/14603* (2013.01); *H01L 27/14645* (2013.01); *H01L 27/14689* (2013.01)

(58) Field of Classification Search
CPC ..................... H01L 27/14603; H01L 27/1461; H01L 27/14612; H01L 27/1463; H01L 27/1464; H01L 27/14645; H01L 27/14689
See application file for complete search history.

(56) References Cited

U.S. PATENT DOCUMENTS

| 6,992,714 | B1 * | 1/2006 | Hashimoto et al. ........... 348/273 |
| 2003/0189237 | A1 | 10/2003 | Koizumi |
| 2004/0161868 | A1 | 8/2004 | Hong |
| 2004/0232314 | A1 | 11/2004 | Hong |
| 2005/0194653 | A1 | 9/2005 | Hynecek et al. |

(Continued)

FOREIGN PATENT DOCUMENTS

| JP | S61-183958 A | 8/1986 |
| JP | 2003-298102 A | 10/2003 |

(Continued)

*Primary Examiner* — Whitney T Moore
*Assistant Examiner* — Joseph Galvin, III
(74) *Attorney, Agent, or Firm* — Canon USA, Inc., IP Division

(57) ABSTRACT

An image pickup apparatus includes a pixel portion in which pixels are arranged, the pixels each including a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between a surface of a semiconductor substrate. The pixel portion includes a class I pixel and a class II pixel located near a reference contact. A distance between the surface of the semiconductor substrate and the second semiconductor region of the class I pixel is smaller than a distance between the surface of the semiconductor substrate and the second semiconductor region of the class II pixel.

20 Claims, 12 Drawing Sheets

(56) References Cited

U.S. PATENT DOCUMENTS

| | | |
|---|---|---|
| 2005/0263804 A1 | 12/2005 | Yoshihara |
| 2007/0092985 A1 | 4/2007 | Yoshihara |
| 2008/0073677 A1 | 3/2008 | Yoshihara |
| 2008/0179641 A1 | 7/2008 | Asaba |
| 2009/0207294 A1 | 8/2009 | Hynecek et al. |
| 2009/0212336 A1* | 8/2009 | Iwata et al. .................. 257/292 |
| 2009/0294815 A1 | 12/2009 | Otsuki et al. |
| 2010/0167449 A1 | 7/2010 | Yoshihara |
| 2011/0001207 A1 | 1/2011 | Takase et al. |
| 2011/0068251 A1 | 3/2011 | Narui |
| 2012/0191716 A1 | 7/2012 | Omoigui |
| 2012/0292727 A1* | 11/2012 | Huang .......................... 257/432 |

FOREIGN PATENT DOCUMENTS

| | | |
|---|---|---|
| JP | 2004-273952 A | 9/2004 |
| JP | 2005-347325 A | 12/2005 |
| JP | 2006-310343 A | 11/2006 |
| JP | 2007-524985 A | 8/2007 |
| JP | 2007-531254 A | 11/2007 |
| JP | 2008-187169 A | 8/2008 |
| JP | 2009-026984 A | 2/2009 |
| JP | 2009-289872 A | 12/2009 |
| JP | 2010-272666 A | 12/2010 |
| JP | 2011-061767 A | 3/2011 |
| JP | 2011-014773 A | 12/2011 |
| JP | 2011-249825 A | 12/2011 |

* cited by examiner

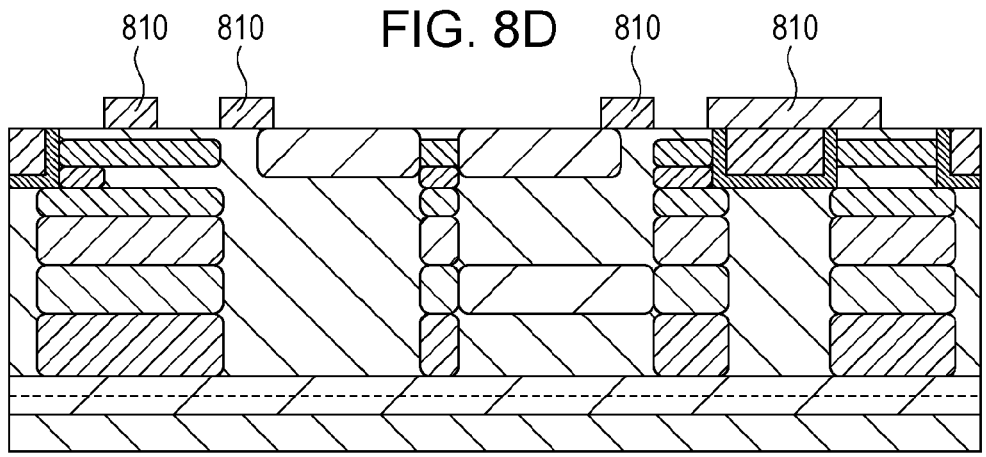
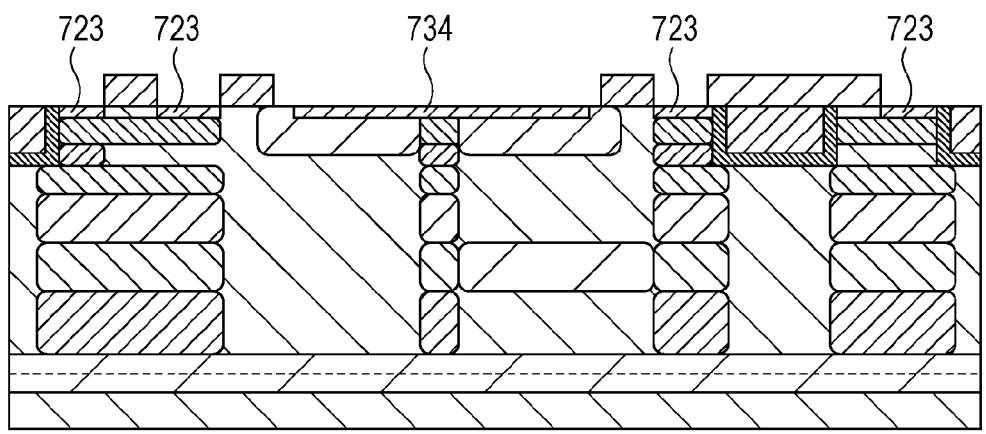
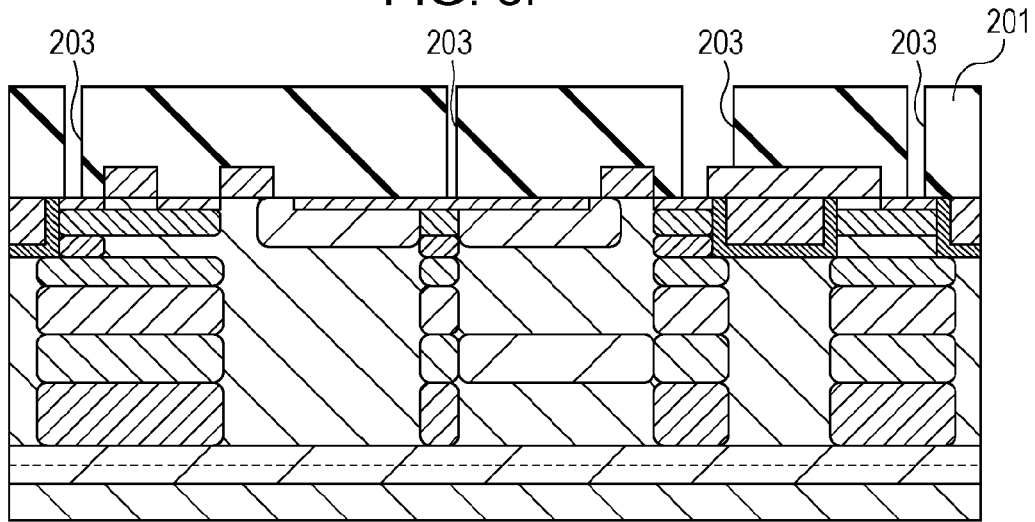

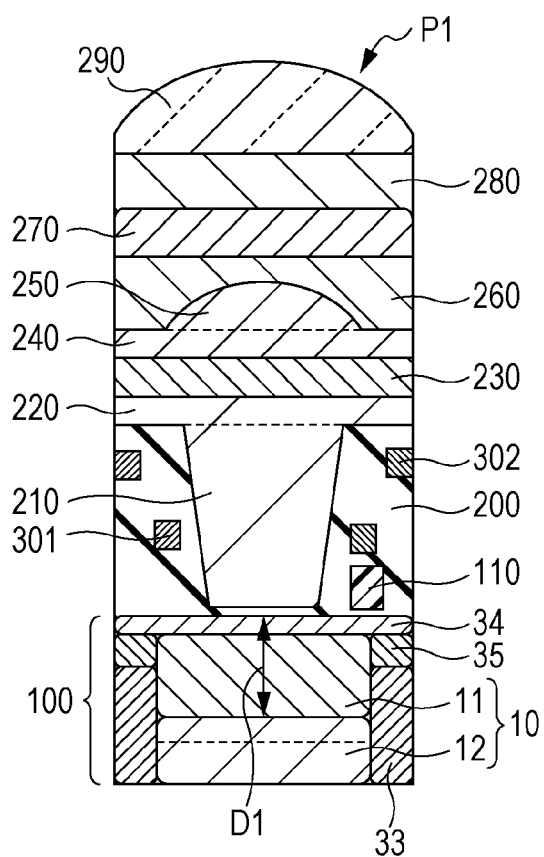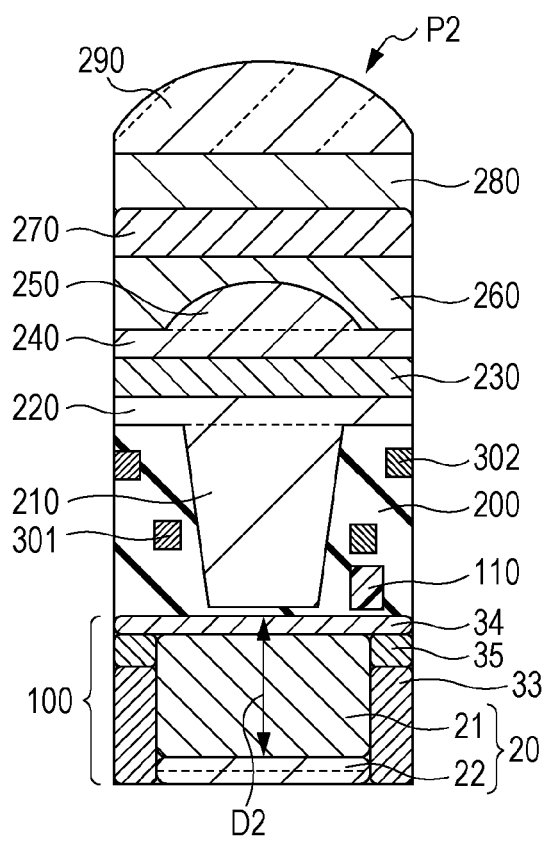

IMAGE PICKUP APPARATUS AND IMAGE PICKUP SYSTEM

BACKGROUND

1. Field of the Disclosure

The present disclosure relates to an image pickup apparatus that has contacts for supplying a reference potential. The present disclosure also relates to an image pickup apparatus that includes color filters.

2. Description of the Related Art

In a semiconductor substrate of an image pickup apparatus which is a semiconductor apparatus, a signal charge accumulated in a semiconductor region of first conductivity type having signal charges as majority carriers is separated, for each pixel, by a semiconductor region of second conductivity type having signal charges as minority carriers. Reference contacts for supplying a reference potential to semiconductor regions of second conductivity type are provided on the semiconductor substrate. Japanese Patent Laid-Open Nos. 2009-289872 and 2011-14773 describe a technique in which substrate contacts are not uniformly distributed among pixels, but are distributed only to specific pixels.

In an image pickup unit of an image pickup apparatus, pixels, each including a photoelectric conversion element inside a semiconductor substrate and a color filter on the semiconductor substrate, are arranged two-dimensionally. In a solid-state image sensing device disclosed in Japanese Patent Laid-Open No. 2009-26984, pixels have respective color filters arranged in a Bayer pattern. Basic two-by-two pixel units, each including one R pixel, one B pixel, and two G pixels, are arranged in a matrix. A signal charge generated in a pixel is associated with the intensity of light that has passed through a color filter of the pixel, and a color image is formed in accordance with the signal charge. Color mixture occurs in a captured image if a correspondence between a color filter through which light has actually passed and a color filter of a pixel with which a signal charge generated by the light is associated is not appropriate.

SUMMARY

An image pickup apparatus according to a first aspect of the present disclosure includes a pixel portion in which pixels are arranged. The pixels each include a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between the second semiconductor region and a surface of a semiconductor substrate. The first semiconductor regions of two adjacent pixels are separated by a third semiconductor region of second conductivity type, the second semiconductor regions of the two adjacent pixels are electrically connected to the third semiconductor region, and a reference contact that applies a reference potential via the third semiconductor region to the second semiconductor regions is provided on the surface of the semiconductor substrate. The pixel portion includes a class I pixel and a class II pixel located near the reference contact. A distance between the surface and the second semiconductor region of the class I pixel is smaller than a distance between the surface and the second semiconductor region of the class II pixel. A distance between the reference contact and the first semiconductor region of the class I pixel is smaller than a distance between the reference contact and the first semiconductor region of the class II pixel.

An image pickup apparatus according to a second aspect of the present disclosure includes an image pickup unit in which pixels are arranged. The pixels each include a photoelectric conversion element and a transfer gate. The photoelectric conversion element includes a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between the second semiconductor region and a surface of a semiconductor substrate. The transfer gate includes a polysilicon gate electrode on the surface side of the semiconductor substrate, the transfer gate being configured to transfer a signal charge. The image pickup unit includes a type I pixel including a color filter whose main transmission wavelength is a first wavelength, the color filter being disposed on the surface side of the semiconductor substrate; a type II pixel including a color filter whose main transmission wavelength is a second wavelength different from the first wavelength, the color filter being disposed on the surface side of the semiconductor substrate; and a type III pixel including a color filter whose main transmission wavelength is a third wavelength longer than the first wavelength and the second wavelength, the color filter being disposed on the surface side of the semiconductor substrate. A distance between the surface and the second semiconductor region of the type I pixel is smaller than a distance between the surface and the second semiconductor region of the type III pixel. In at least part of the image pickup unit, the photoelectric conversion element of the type III pixel and the photoelectric conversion element of the type I pixel are arranged in this order from a center toward an outer edge of the image pickup unit, and the transfer gate of the type III pixel is disposed between the photoelectric conversion element of the type III pixel and the photoelectric conversion element of the type I pixel.

Further features of the present invention will become apparent from the following description of exemplary embodiments with reference to the attached drawings.

BRIEF DESCRIPTION OF THE DRAWINGS

FIGS. 8D to 8F provide schematic cross-sectional views illustrating a method for manufacturing the image pickup apparatus.

FIGS. 10A and 10B are each a schematic cross-sectional view of a pixel.

DESCRIPTION OF THE EMBODIMENTS

Figure 1A:
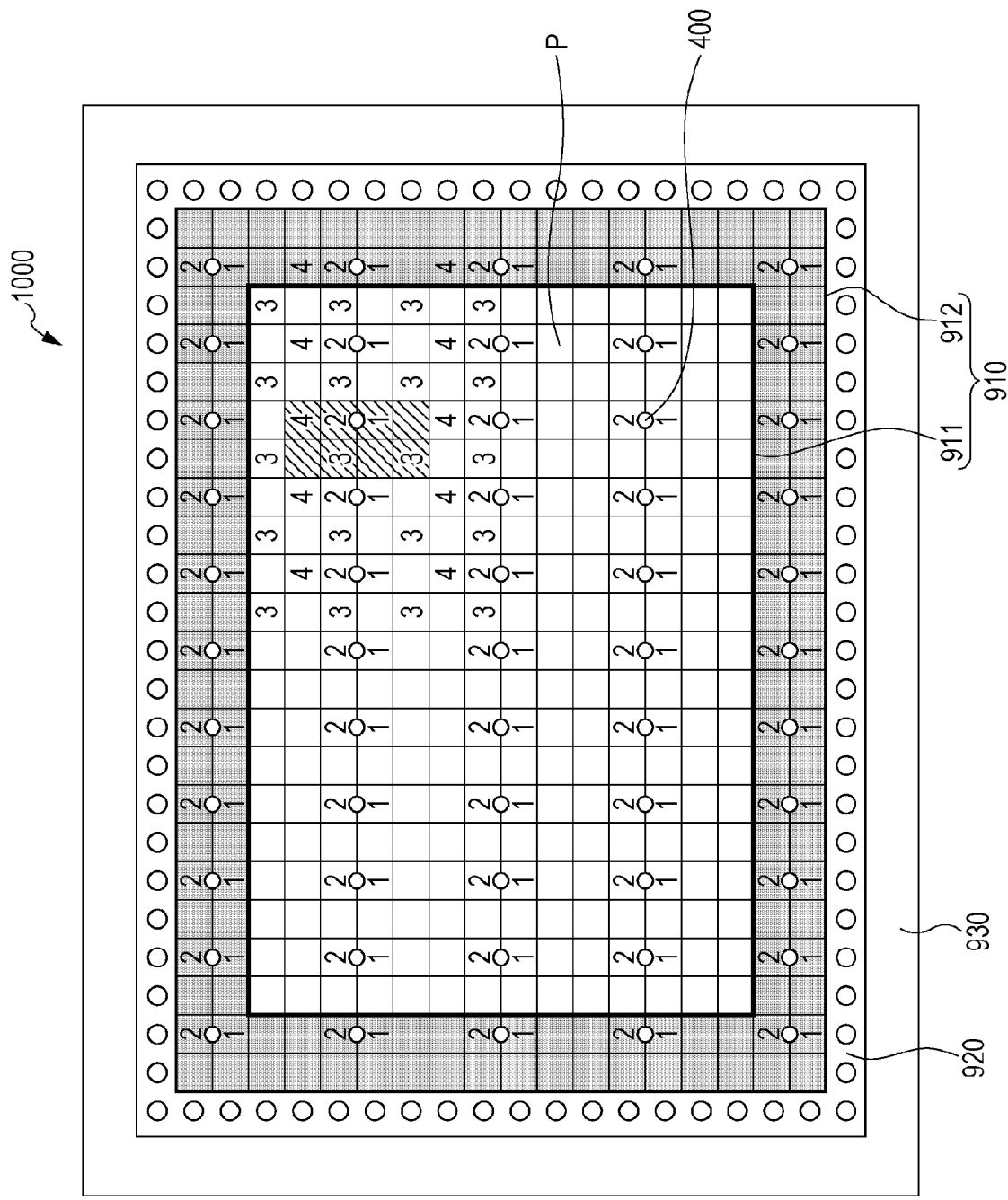
FIGS. 1A and 1B provide schematic plan views of an image pickup apparatus.

The level of noise in pixels close to a reference contact tends to be higher than that in pixels away from the reference contact. Therefore, the present embodiment provides an image pickup apparatus that can reduce the effect of noise caused by reference contacts and realize a high quality image.

Specifically, the present embodiment provides an image pickup apparatus that includes a pixel portion in which pixels are arranged. The pixels each include a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between the second semiconductor region and a surface of a semiconductor substrate. The first semiconductor regions of the respective pixels are separated by a third semiconductor region of second conductivity type, and the second semiconductor regions of the respective pixels are electrically connected to the third semiconductor region. In the image pickup apparatus, a reference contact that applies a reference potential via the third semiconductor region to the second semiconductor regions is provided on the surface of the semiconductor substrate. The pixel portion includes a class I pixel and a class II pixel located near the reference contact. A distance between the surface and the second semiconductor region of the class I pixel is smaller than a distance between the surface and the second semiconductor region of the class II pixel. A distance between the reference contact and the first semiconductor region of the class I pixel is smaller than a distance between the reference contact and the first semiconductor region of the class II pixel.

The image pickup apparatus of the present embodiment can provide a high quality image.

In an image captured by an image pickup apparatus of the related art, there is a phenomenon in which, due to color mixture, a color of a portion corresponding to a specific area of an image pickup unit is different from a color of a portion corresponding to another area of the image pickup unit.

Therefore, the present embodiment also provides an image pickup apparatus that can reduce color mixture.

Specifically, the present embodiment provides an image pickup apparatus that includes an image pickup unit in which pixels are arranged. The pixels each include a photoelectric conversion element and a transfer gate. The photoelectric conversion element includes a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between the second semiconductor region and a surface of a semiconductor substrate. The transfer gate includes a polysilicon gate electrode on the surface side of the semiconductor substrate, and transfers a signal charge. The image pickup unit includes a type I pixel including a color filter whose main transmission wavelength is a first wavelength, the color filter being disposed on the surface side of the semiconductor substrate; a type II pixel including a color filter whose main transmission wavelength is a second wavelength different from the first wavelength, the color filter being disposed on the surface side of the semiconductor substrate; and a type III pixel including a color filter whose main transmission wavelength is a third wavelength longer than the first wavelength and the second wavelength, the color filter being disposed on the surface side of the semiconductor substrate. A distance between the surface and the second semiconductor region of the type I pixel is smaller than a distance between the surface and the second semiconductor region of the type III pixel. In at least part of the image pickup unit, the photoelectric conversion element of the type III pixel and the photoelectric conversion element of the type I pixel are arranged in this order from a center toward an outer edge of the image pickup unit. The transfer gate of the type III pixel is disposed between the photoelectric conversion element of the type III pixel and the photoelectric conversion element of the type I pixel.

The image pickup apparatus of the present embodiment can reduce color mixture.

An image pickup apparatus according to an embodiment will now be described with reference to the drawings.

FIG. 1A is a schematic plan view of an image pickup apparatus 1000. The image pickup apparatus 1000 of the present example has a pixel portion 910, an intermediate portion 920, and a peripheral portion 930. The pixel portion 910 includes a plurality of pixels P arranged two-dimensionally. The pixel portion 910 may include a pixel circuit that generates electric signals from signal charges obtained in the pixels P. The pixel portion 910 may include a light-receiving pixel section 911 and a light-shielding pixel section 912. An image is formed in accordance with electric signals obtained in the light-receiving pixel section 911. Electric signals obtained in the light-shielding pixel section 912 are used in signal processing, such as noise reduction. The light-receiving pixel section 911 serves as an image pickup unit. In FIG. 1A, the light-receiving pixel section 911 includes a total of 266 pixels arranged in 14 rows and 19 columns, and the light-shielding pixel section 912 includes a total of 148 pixels. This means that the pixel portion 910 includes a total of 414 pixels. In an image pickup apparatus actually used, the number of pixels may be several hundreds of thousands to several tens of millions. Although the light-shielding pixel section 912 of the present example extends along four sides of the image pickup apparatus 1000 to surround the light-receiving pixel section 911, the light-shielding pixel section 912 may be provided along only two adjacent sides, only two opposite sides, or only one side of the image pickup apparatus 1000. The peripheral portion 930 includes a driving circuit that drives the pixel circuit, and a so-called peripheral circuit, such as a signal processing circuit, that processes electric signals obtained in the light-receiving pixel section 911. In addition to the peripheral circuit, the peripheral portion 930 includes alignment marks and electrode pads that communicate with external devices. Although the intermediate portion 920 is provided between the peripheral portion 930 and the pixel portion 910 to surround the pixel portion 910, the intermediate portion 920 may be omitted.

FIGS. 10A and 10B are each a schematic cross-sectional view of one pixel P in the light-receiving pixel section 911. One pixel P has one photoelectric conversion element disposed in a semiconductor substrate 100. The semiconductor substrate 100 has a front surface and a back surface (not shown). In the present example, the front surface of the semiconductor substrate 100 serves as a light receiving surface. The pixel portion 910 of the present example includes at least two kinds of pixels having photoelectric conversion elements with different structures. Specifically, the pixel portion 910 includes a class A pixel P1 illustrated in FIG. 10A and a class B pixel P2 illustrated in FIG. 10B. For example, in FIG. 1A, pixels indicated by "1" and "4" are class A pixels, and pixels indicated by "2" and "3" are class B pixels. For example, in FIG. 1B, pixels indicated by "1" are class A pixels, and pixels indicated by "3" are class B pixels. Although pixels indicated by "2" and "4" are class B pixels in the present example, they may be class A pixels. Pixels without numbers may be either class A or B pixels.

Referring back to FIGS. 10A and 10B, a photoelectric conversion element 10 of the class A pixel P1 has a first semiconductor region 11 of first conductivity type having signal charges as majority carriers. Also, the photoelectric conversion element 10 has a second semiconductor region 12 of second conductivity type having signal charges as minority carriers. The first semiconductor region 11 and the second semiconductor region 12 are arranged in this order from the front surface to the back surface of the semiconductor substrate 100. That is, the first semiconductor region 11 is located between the front surface of the semiconductor substrate 100 and the second semiconductor region 12. The second semiconductor region 12 is contiguous to the first semiconductor region 11. Specifically, the first semiconductor region 11 and the second semiconductor region 12 connect to each other to form a PN junction. That is, the second semiconductor region 12 is distinct from a semiconductor region of second conductivity type that is located in a deeper part of the semiconductor substrate 100 and does not form a PN junction with the first semiconductor region 11.

A photoelectric conversion element 20 of the class B pixel P2 has a first semiconductor region 21 of first conductivity type having signal charges as majority carriers. Also, the photoelectric conversion element 20 has a second semiconductor region 22 of second conductivity type having signal charges as minority carriers. The first semiconductor region 21 and the second semiconductor region 22 are arranged in this order from the front surface to the back surface of the semiconductor substrate 100. That is, the first semiconductor region 21 is located between the front surface of the semiconductor substrate 100 and the second semiconductor region 22. The second semiconductor region 22 is contiguous to the first semiconductor region 21. Specifically, the first semiconductor region 21 and the second semiconductor region 22 connect to each other to form a PN junction. That is, the second semiconductor region 22 is distinct from a semiconductor region of second conductivity type that is located in a deeper part of the semiconductor substrate 100 and does not form a PN junction with the first semiconductor region 21.

In the present example, a signal charge is an electron, the first conductivity type is the N type, and the second conductivity type is the P type. When a signal charge is a positive hole, the first conductivity type is the P type and the second conductivity type is the N type. A semiconductor region where charges with the same polarity as that of signal charges are majority carriers is of first conductivity type, and a semiconductor region where charges with a polarity opposite that of signal charges are minority carriers is of second conductivity type.

The photoelectric conversion element 10 of the class A pixel P1 and the photoelectric conversion element 20 of the class B pixel P2 are different in the depths of the first and second semiconductor regions from the front surface of the semiconductor substrate 100. The first semiconductor region 21 of the class B pixel P2 extends deeper from the front surface of the semiconductor substrate 100 than the first semiconductor region 11 of the class A pixel P1 does. The second semiconductor region 12 of the class A pixel P1 is located at a level shallower from the front surface of the semiconductor substrate 100 than the second semiconductor region 22 of the class B pixel P2 is. When a distance from the front surface of the semiconductor substrate 100 to the second semiconductor region 12 is defined as a first distance D1 and a distance from the front surface of the semiconductor substrate 100 to the second semiconductor region 22 is defined as a second distance D2, the first distance D1 is smaller than the second distance D2 (D1<D2). For example, the first distance D1 can range from 1 µm to 3 µm, and the second distance D2 can range from 2 µm to 5 µm. A PN junction plane at the boundary between the first semiconductor region and the second semiconductor region in the class A pixel P1 can be located closer to the front surface of the semiconductor substrate 100 than that in the class B pixel P2 can be.

The second semiconductor regions 12 and 22 each can include a portion exhibiting a peak impurity concentration of the second conductivity type within the semiconductor region of second conductivity type continuous in the depth direction. In FIGS. 10A and 10B, a portion exhibiting a peak impurity concentration is indicated by a dotted line, and such a portion serves as a substantial potential barrier. A position where the second semiconductor region 12 of the class A pixel P1 exhibits a peak impurity concentration can be located closer to the front surface of the semiconductor substrate 100 than that where the second semiconductor region 22 of the class B pixel P2 exhibits a peak impurity concentration can be.

Except for the photoelectric conversion elements 10 and 20 in the semiconductor substrate 100, the configurations of the class A pixel P1 and the class B pixel P2 do not need to be different from each other. A third semiconductor region 33 of second conductivity type is provided around the first semiconductor regions 11 and 21. The third semiconductor region 33 is disposed between adjacent pixels, so that photoelectric conversion elements of the adjacent pixels are separated by a PN junction (junction isolation). In the present example, a fourth semiconductor region 34 of second conductivity type is provided as a surface shield region between the front surface of the semiconductor substrate 100 and the first semiconductor regions 11 and 21. With the fourth semiconductor region 34, the photoelectric conversion elements 10 and 20 each serve as a so-called embedded type photodiode. In the present example, a fifth semiconductor region 35 is provided as an intermediate region between the third semiconductor region 33 and the fourth semiconductor region 34.

The second semiconductor regions 12 and 22 and the third semiconductor region 33, which are semiconductor regions of second conductivity type, are electrically connected and can be substantially equipotential to each other. The third semiconductor region 33 and the fourth semiconductor region 34 are electrically connected via the fifth semiconductor region 35 and can be substantially equipotential to each other. That is, there is an electrical connection from the front surface of the semiconductor substrate 100 to the second semiconductor regions 12 and 22 via the third semiconductor region 33, the fourth semiconductor region 34, and the fifth semiconductor region 35. Although the fifth semiconductor region 35 serving as an intermediate region is typically of second conductivity type, the fifth semiconductor region 35 may be a semiconductor region of first conductivity type having a low impurity concentration, as long as a reference potential can be applied to the third semiconductor region 33. The fifth semiconductor region 35 may be omitted to allow the third semiconductor region 33 and the fourth semiconductor region 34 to be in contact with each other.

In the present example, on the front surface side of the semiconductor substrate 100, there are a first lens 290, a color filter 270, a second lens 250, a low-refractive-index film 230, an optical waveguide 210, and an insulating film 200 arranged in this order toward the front surface of the semiconductor substrate 100. A first intermediate film 280 is disposed between the first lens 290 and the color filter 270, and a second intermediate film 260 is disposed between the color filter 270 and the second lens 250. A first high-refractive-index film 240 is disposed between the second lens 250 and the low-refractive-index film 230, and a second high-refractive-index film 220 is disposed between the low-refractive-index film 230 and the optical waveguide 210.

The optical waveguide 210 and the second high-refractive-index film 220 may be integrally formed of the same material, and the first high-refractive-index film 240 and the second lens 250 may also be integrally formed of the same material. The low-refractive-index film 230 has a refractive index lower than those of the first high-refractive-index film 240 and the second high-refractive-index film 220. The low-refractive-index film 230 may be omitted to allow the second high-refractive-index film 220 and the first high-refractive-index film 240 to be in contact with each other, and the second high-refractive-index film 220 and the first high-refractive-index film 240 may be integrally formed of the same material. The optical waveguide 210 is surrounded by the insulating film 200 that includes at least a low-refractive-index layer having a refractive index lower than that of the optical waveguide 210. With this configuration where the optical waveguide 210 serves as a core and the low-refractive-index layer serves as a cladding, light can propagate in the optical waveguide 210 with low loss. The insulating film 200 includes a plurality of conductive layers 301 and 302 for wiring.

The low-refractive-index layer of the insulating film 200 can serve as an interlayer insulating layer for insulation between the conductive layers 301 and 302. The insulating film 200 can further include an anti-diffusion layer for preventing diffusion of metal contained in the conductive layers 301 and 302. The anti-diffusion layer may have a refractive index higher than that of the optical waveguide 210. The first lens 290, the second lens 250, the first high-refractive-index film 240, and the second high-refractive-index film 220 can each include an anti-reflection layer for reducing reflection of light between layers. A polysilicon gate electrode 110 for a metal oxide semiconductor (MOS) gate or a MOS transistor is disposed between the insulating film 200 and the semiconductor substrate 100.

In the pixel portion 910, color filters for three primary colors RGB are arranged in a Bayer pattern to form a color filter array. Also in the pixel portion 910, a plurality of pixels P form an optical waveguide array, a first lens array, and a second lens array. The first intermediate film 280 and the second intermediate film 260 extend over the pixel portion 910 to serve as planarizing layers. Each pixel in the light-shielding pixel section 912 has a light-shielding film (not shown) for preventing light from entering the photoelectric conversion element. The pixel configuration is not limited to this example. At least one of the components described above may be omitted, or some optical element, mechanical element, or chemical element may be added to the pixel configuration described above. Although a complementary metal-oxide semiconductor (CMOS) sensor of so-called front-surface illumination type is used in the present example, the CMOS sensor may be of back-surface illumination type, or may even be replaced by a charge coupled device (CCD) sensor.

The image pickup apparatus 1000 is included in an image pickup system, such as a camera or a camera-equipped information terminal.

Figure 9:
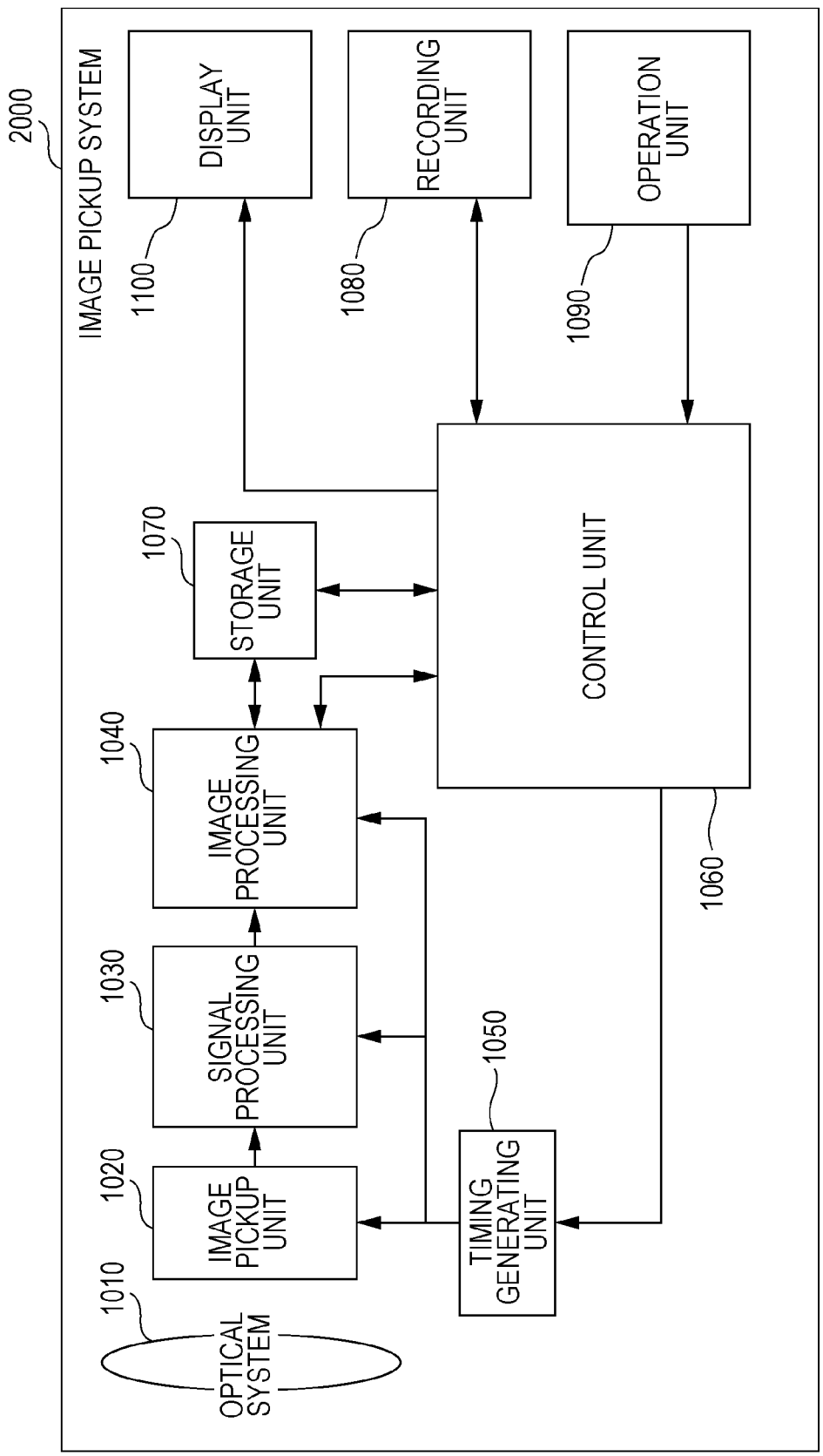
FIG. 9 is a block diagram of an image pickup system.

FIG. 9 is a block diagram of an image pickup system 2000. The image pickup system 2000 includes an optical system 1010 that guides light to an image pickup unit 1020. The optical system 1010 may include a lens, a shutter, and an aperture. The image pickup system 2000 may include a signal processing unit 1030 that processes an electric signal obtained from the image pickup unit 1020, and an image processing unit 1040 that generates an image signal on the basis of the signal processed by the signal processing unit 1030. The signal processing unit 1030 may include an analog signal processor, an analog-to-digital converter, and a digital signal processor. The image pickup apparatus 1000, which is a semiconductor apparatus, includes at least the image pickup unit 1020, but may further include some or all components of the signal processing unit 1030. The image signal obtained from the image pickup apparatus 1000 may be either an analog or digital signal. The image pickup system 2000 includes a timing generating unit 1050 for synchronization of the image pickup unit 1020, the signal processing unit 1030, and the image processing unit 1040. The image pickup system 2000 further includes a control unit 1060 that performs various types of computation to control the image pickup system 2000, and a storage unit 1070 that stores image data for the computation. The image pickup system 2000 further includes a recording unit 1080 that records image data, an operation unit 1090 that has an interface for operating the image pickup system 2000, and a display unit 1100 that displays a captured image.

Figure 2:
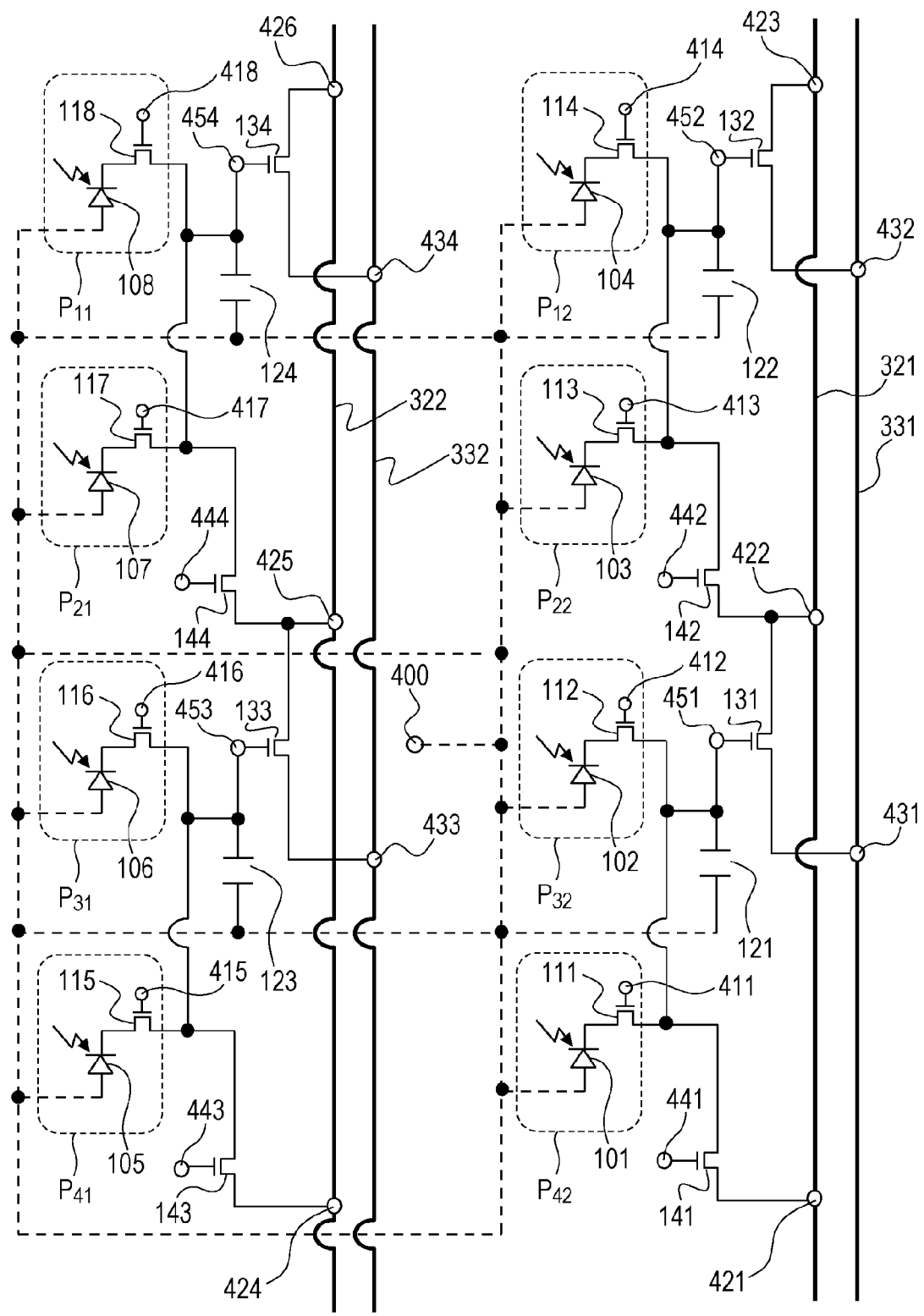
FIG. 2 is an equivalent circuit diagram of a pixel portion.

FIG. 2 is an equivalent circuit diagram of a unit structure corresponding to a hatched area in the light-receiving pixel section 911 of FIG. 1A. As illustrated, the unit structure includes eight pixels arranged in four rows and two columns. Hereinafter, a pixel located at the first row and the first column is denoted as $P_{11}$, and a pixel located at the i-th row and the j-th column is denoted as $P_{ij}$.

Photoelectric conversion elements 101 to 108 of the respective pixels are photodiodes, each of which may have the structure of either the photoelectric conversion element 10 illustrated in FIG. 10A or the photoelectric conversion element 20 illustrated in FIG. 10B. The first semiconductor regions 11 and 21 each may serve as a cathode of the photodiode, and the second semiconductor regions 12 and 22 each may serve as an anode of the photodiode. In FIG. 2, an electrical path indicated by a dotted line corresponds to the third semiconductor region 33. Although described in detail below, the pixels $P_{12}$ and $P_{32}$ are class A pixels, and the pixels $P_{11}$, $P_{21}$, $P_{31}$, $P_{41}$, $P_{22}$, and $P_{42}$ are class B pixels in the present example.

The pixels in FIG. 2 include respective transfer gates 111 to 118 connected to the respective photoelectric conversion elements 101 to 108. The photoelectric conversion elements 101 to 108 of the pixels are connected via the respective transfer gates 111 to 118 to appropriate floating diffusion regions 121 to 124. The transfer gates 111 to 118 transfer, from the photoelectric conversion elements 101 to 108 to the corresponding floating diffusion regions 121 to 124, signal charges collected in the photoelectric conversion elements 101 to 108. The transfer gates 111 to 118, the photoelectric conversion elements 101 to 108, and the floating diffusion regions 121 to 124 form transistors having the photoelectric conversion elements 101 to 108 as their sources and the floating diffusion regions 121 to 124 as their drains. In the present example, the pixels $P_{32}$ and $P_{42}$ are connected to the first floating diffusion region 121, the pixels $P_{12}$ and $P_{22}$ are connected to the second floating diffusion region 122, the pixels $P_{31}$ and $P_{41}$ are connected to the third floating diffusion region 123, and the pixels $P_{11}$ and $P_{21}$ are connected to the fourth floating diffusion region 124. Although a plurality of transfer gates can be connected to a single common floating diffusion region as described above, transfer gates of all pixels may be connected to different floating diffusion regions.

The image pickup apparatus 1000 of the present example is an image pickup apparatus of so-called pixel amplification type in which a pixel circuit in the pixel portion 910 includes an amplifying transistor. The pixel portion 910 includes a plurality of amplifying transistors 131 to 134. The amplifying transistors 131 to 134 generate electric signals based on signal charges of the photoelectric conversion elements 101 to 108 in the corresponding pixels. A pixel circuit is provided for each pixel group. In the present example, the eight pixels arranged in four rows and two columns are divided into four groups: a first pixel group composed of the pixels $P_{32}$ and $P_{42}$, a second pixel group composed of the pixels $P_{12}$ and $P_{22}$, a third pixel group composed of the pixels $P_{31}$ and $P_{41}$, and a fourth pixel group composed of the pixels $P_{11}$ and $P_{21}$.

The first floating diffusion region 121 corresponding to the pixels $P_{32}$ and $P_{42}$ is connected to a gate of the first amplifying transistor 131. The second floating diffusion region 122 corresponding to the pixels $P_{12}$ and $P_{22}$ is connected to a gate of the second amplifying transistor 132. The third floating diffusion region 123 corresponding to the pixels $P_{31}$ and $P_{41}$ is connected to a gate of the third amplifying transistor 133. The fourth floating diffusion region 124 corresponding to the pixels $P_{11}$ and $P_{21}$ is connected to a gate of the fourth amplifying transistor 134.

The first floating diffusion region 121 is connected to a source of a first reset transistor 141. The second floating diffusion region 122 is connected to a source of a second reset transistor 142. The third floating diffusion region 123 is connected to a source of a third reset transistor 143. The fourth floating diffusion region 124 is connected to a source of a fourth reset transistor 144.

The pixel circuit of the present example has a pixel sharing structure where two pixels in each pixel group share one amplifying transistor and one reset transistor. Signal charges of a plurality of pixels are added up in a floating diffusion region, so that an electric signal based on the resulting signal charge can be generated. Alternatively, by controlling transfer timing for each pixel, an electric signal based on a signal charge of each pixel can be generated in one floating diffusion region. The pixel circuit may have a pixel sharing structure where four pixels in each pixel group share one amplifying transistor, or may not have such a pixel sharing structure and one amplifying transistor may be provided for each pixel. Although the present example uses a three-transistor configuration including a transfer gate, a four-transistor configuration may be used, which includes a selecting transistor connected to a source of an amplifying transistor. Although the number of amplifying transistors in the pixel portion 910 may be the same as the number of pixels in the pixel portion 910, it may be less than the number of pixels in the pixel portion 910 or may even be equal to or less than half the number of pixels in the pixel portion 910. In the present example, the number of amplifying transistors in the pixel portion 910 is half the number of pixels in the pixel portion 910.

An electrical connection indicated by an open circle in FIG. 2 is a so-called contact, which is a connection region where a wire and a semiconductor device are connected. Typically, a connection between a wire and a semiconductor device is realized when, for example, a tungsten contact plug disposed between the semiconductor substrate 100 and a wiring pattern mainly composed of aluminum or copper is ohmic-joined to the semiconductor substrate 100. Therefore, the position of a contact corresponds to the position of a contact plug. Note that an electrical connection indicated by a filled circle in FIG. 2 is a connection between semiconductors within the semiconductor substrate 100. The connection between semiconductors may be either a PN junction or a junction of regions of the same conductivity type having different concentrations.

A reference potential is applied from a reference line, which is part of wiring, via a reference contact 400 to the third semiconductor region 33. The reference potential is also applied to the second semiconductor regions 12 and 22 which are anodes of the photodiodes connected to the third semiconductor region 33. The reference potential is used as an anode potential for a photoelectric conversion element, or as a body potential for a transistor in a pixel circuit. The reference potential is typically a fixed potential, but may be modulated. Although a ground potential is used as the fixed potential, a gate bias may be applied as a negative or positive potential.

When the third semiconductor region 33 is a semiconductor substrate, the reference contact 400 may be referred to as a substrate contact. When the third semiconductor region 33 is a well formed in the semiconductor substrate 100, the reference contact 400 may be referred to as a well contact.

A drain of the first reset transistor 141 is connected via a first supply contact 421 to a supply line 321 that supplies a supply potential. A drain of the first amplifying transistor 131 is connected via a second supply contact 422 to the supply line 321. A source of the first amplifying transistor 131 is connected via a first output contact 431 to an output line 331. The drain of the first amplifying transistor 131 also serves as a drain of the second reset transistor 142 having the second floating diffusion region 122 as its source. A drain of the second amplifying transistor 132 is connected via a third supply contact 423 to the supply line 321 that supplies a supply potential. A source of the second amplifying transistor 132 is connected via a second output contact 432 to the output line 331. The third amplifying transistor 133 and the fourth amplifying transistor 134 will not be described here, as they have the same relationship as that between the first amplifying transistor 131 and the second amplifying transistor 132. The first supply contact 421, the second supply contact 422, the third supply contact 423, and a fourth supply contact 424 correspond to the first amplifying transistor 131, the second amplifying transistor 132, the third amplifying transistor 133, and the fourth amplifying transistor 134, respectively. The first output contact 431, the second output contact 432, a third output contact 433, and a fourth output contact 434 correspond to the first amplifying transistor 131, the second amplifying transistor 132, the third amplifying transistor 133, and the fourth amplifying transistor 134, respectively. Gate electrodes (amplifying gate electrodes) of the amplifying transistors 131 to 134 and the floating diffusion regions 121 to 124 are connected via a first connection contact 451, a second connection contact 452, a third connection contact 453, and a fourth connection contact 454, respectively. Gate electrodes (transfer gate electrodes) of the transfer gates 111 to 118 corresponding to the respective pixels are connected via transfer gate plugs 411 to 418 to first scanning lines (not shown) that supply transfer signals. Gate electrodes (reset gate electrodes) of the reset transistors 141 to 144 are connected via reset gate plugs 441 to 444 to second scanning lines (not shown) that supply reset signals.

Figure 3A:
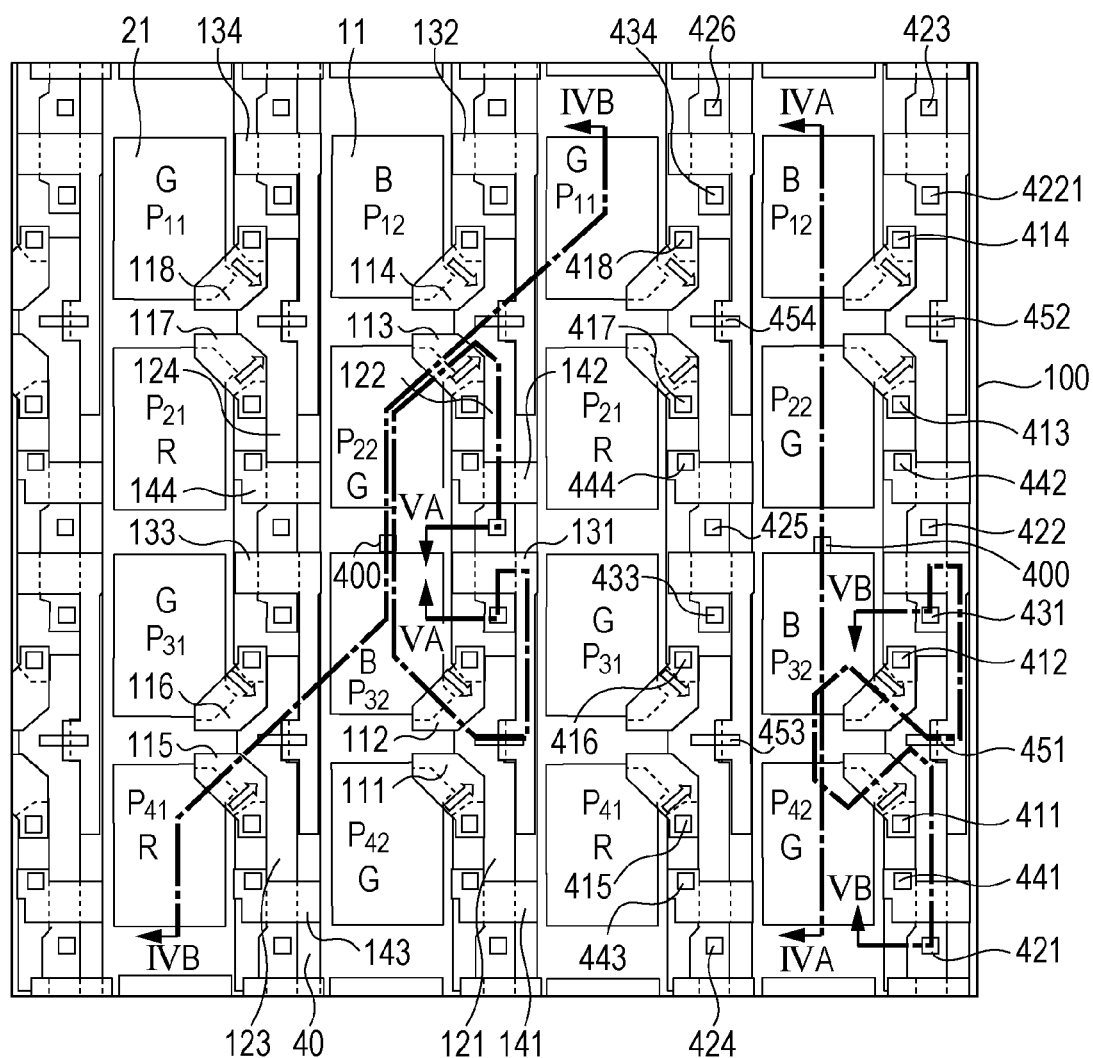
FIGS. 3A and 3B provide schematic plan views of the pixel portion.
Figure 3B:
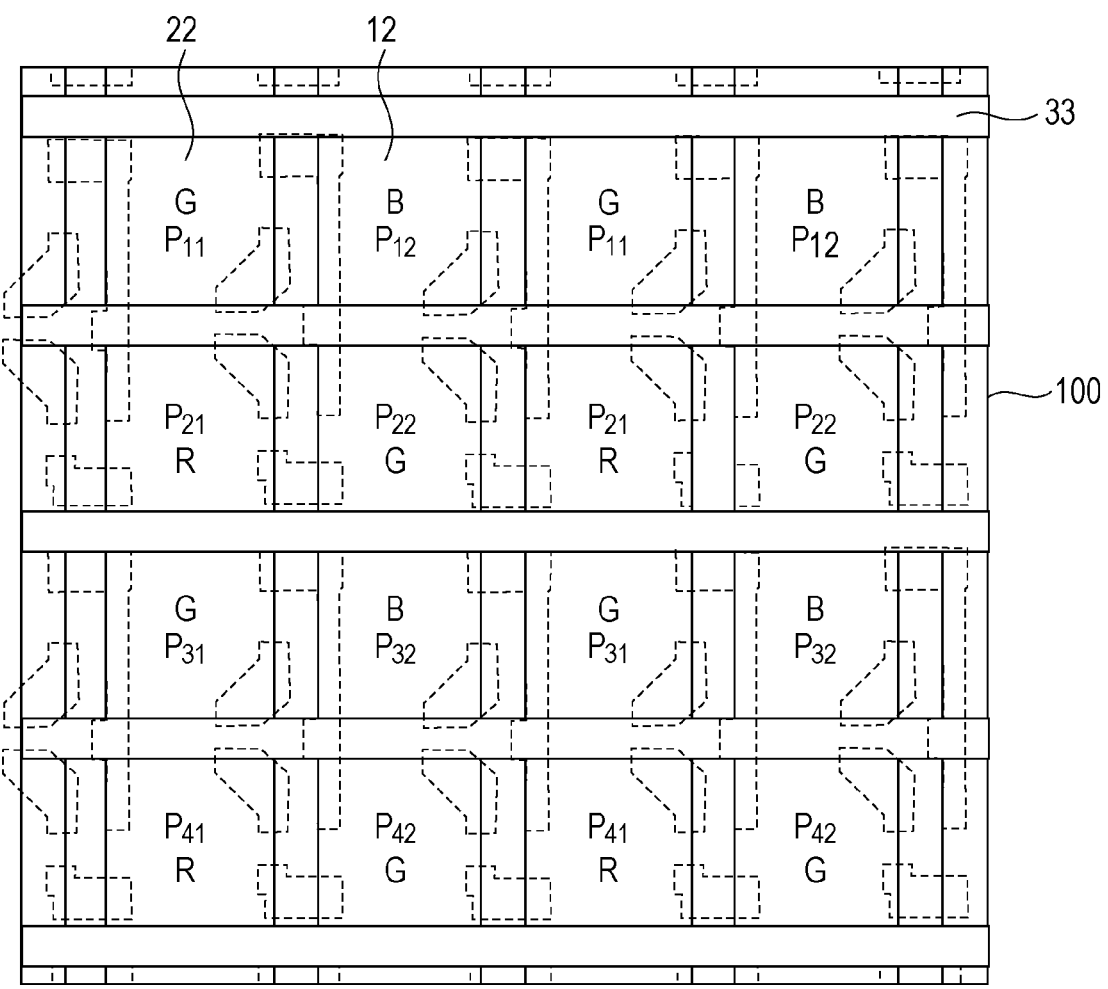
Figure 4A:
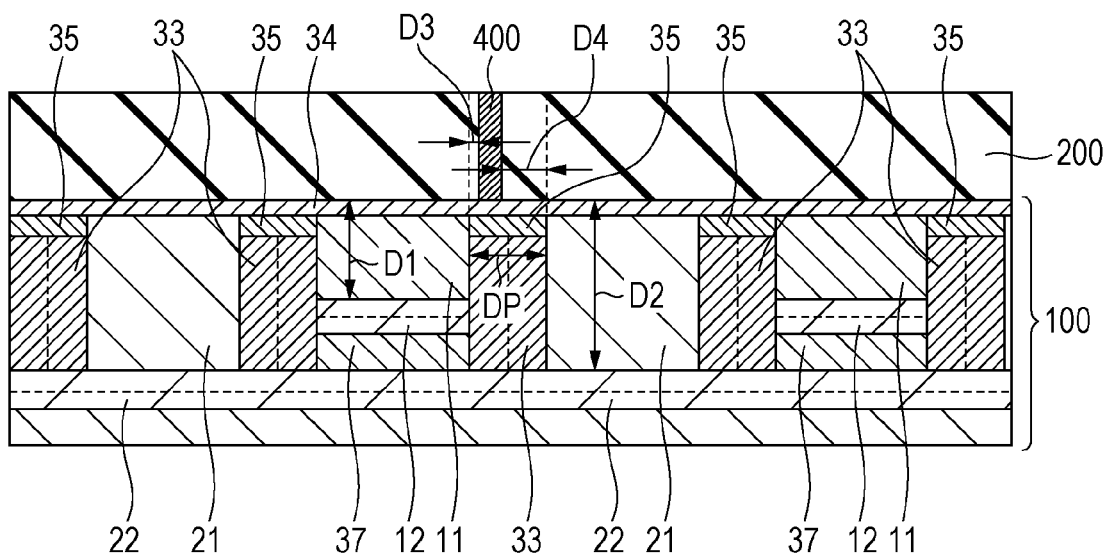
FIGS. 4A and 4B provide schematic cross-sectional views of the pixel portion.

FIGS. 3A and 3B illustrate an area including 16 pixels obtained by arranging two identical units, one of which is illustrated in FIG. 2. FIG. 3A is a schematic plan view of a part of the semiconductor substrate 100 (shallow part) which is shallow from the front surface of the semiconductor substrate 100. FIG. 3B is a schematic plan view of another part of the semiconductor substrate 100 (deep part) which is deeper from the front surface of the semiconductor substrate 100 than the shallow part of FIG. 3A. Note that in each of FIGS. 3A and 3B, not all the illustrated components are located in the same plane. The first and third columns are equivalent, and the second and fourth columns are equivalent. FIG. 4A is a schematic cross-sectional view taken along line IVA-IVA of FIG.

Figure 4B:
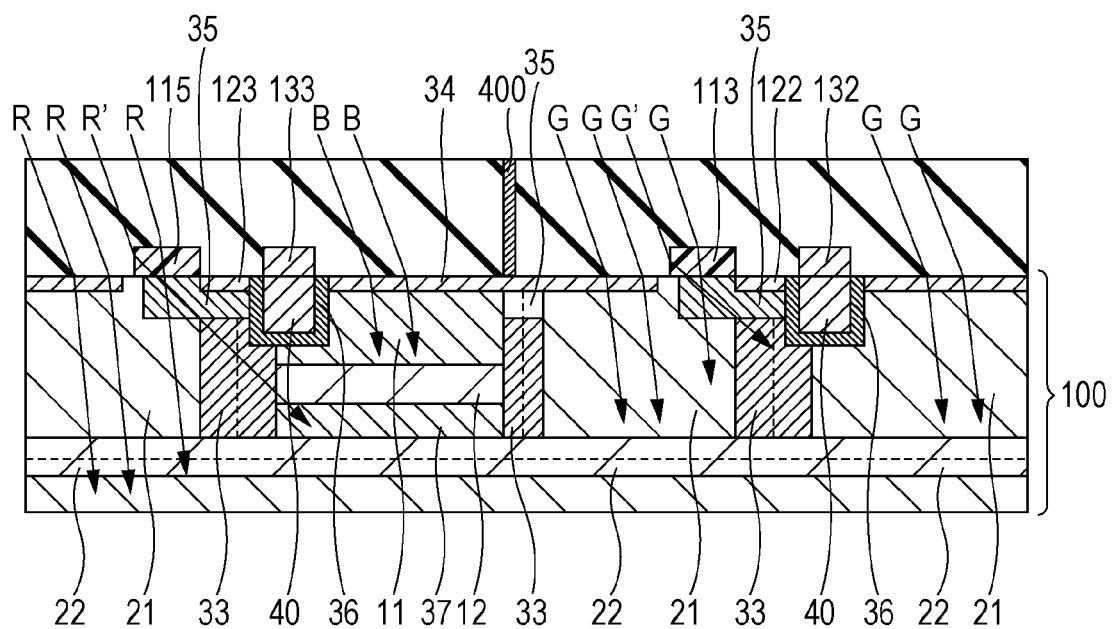
Figure 5A:
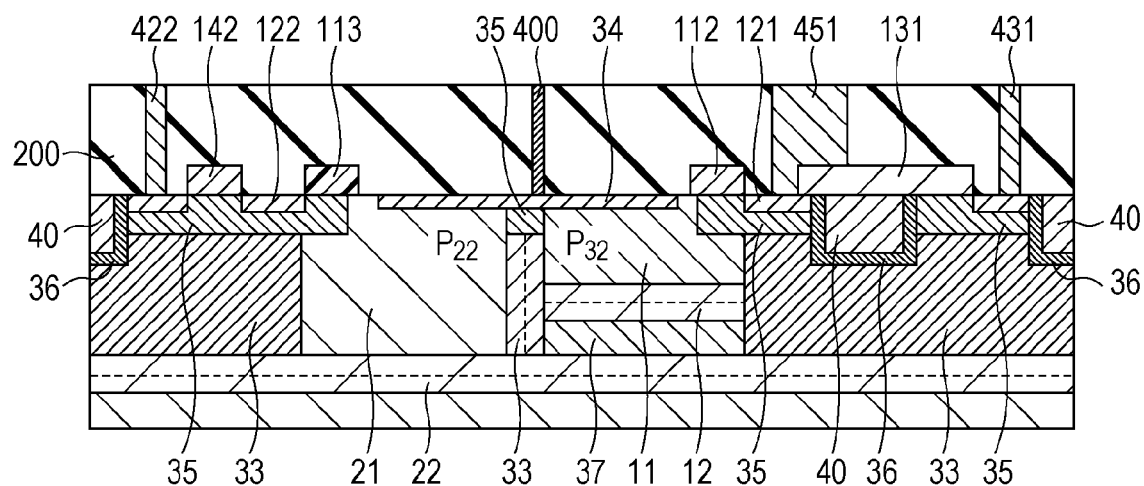
FIGS. 5A and 5B provide schematic cross-sectional views of the pixel portion.
Figure 5B:
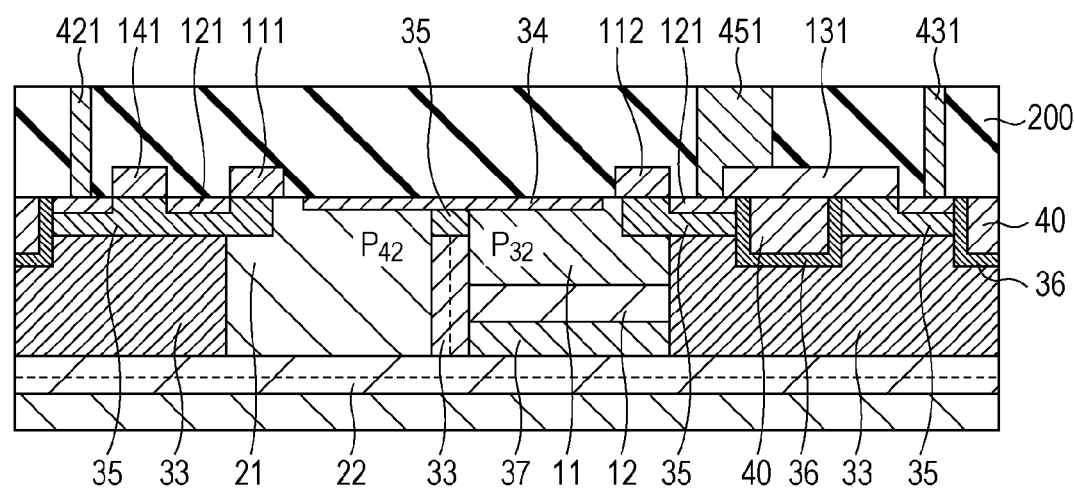

3A. FIG. 4B is a schematic cross-sectional view taken along line IVB-IVB of FIG. 3A. FIG. 5A is a schematic cross-sectional view taken along line VA-VA of FIG. 3A. FIG. 5B is a schematic cross-sectional view taken along line VB-VB of FIG. 3A. In FIGS. 3A and 3B to FIGS. 5A and 5B, the same elements as those described with reference to FIG. 2 are given the same reference numerals and can be cross-referenced to each other, so that the detailed description for each drawing will be omitted.

FIG. 3A illustrates the first semiconductor regions 11 and 21 of first conductivity type, the floating diffusion regions 121 to 124, and a source region and a drain region of each transistor. Reference numeral denoting each transistor is given to its gate electrode. A typical gate electrode is a polysilicon gate electrode.

As illustrated in FIG. 3A, the pixels $P_{12}$ and $P_{32}$ are class A pixels each having the first semiconductor region 11 located at a shallow level, and the pixels $P_{11}$, $P_{21}$, $P_{31}$, $P_{41}$, $P_{22}$, and $P_{42}$ are class B pixels each having the first semiconductor region 21 located at a deep level.

In the semiconductor substrate 100, in a direction (oblique direction) intersecting with the row and column directions, a first semiconductor region, a transfer channel region, and a floating diffusion region are periodically arranged in this order. The transfer channel region is disposed below a transfer gate electrode.

In FIG. 3A, an arrow shown on each transfer gate electrode indicates a transfer direction in which a signal charge is transferred in the transfer channel region. As can be seen from FIG. 3A, the transfer direction in each pixel is either an upper-right direction or a lower-right direction in the drawing. When each of the transfer directions is decomposed into a row direction component and a column direction component, any transfer direction is rightward (in the drawing) for the row direction. For the column direction, a transfer direction in pixels arranged in odd-numbered rows is downward, whereas a transfer direction in pixels arranged in even-numbered rows is upward. That is, for pixels in the first and second rows and the same column and for pixels in the third and fourth rows and the same column, their signal charges are transferred in directions toward each other, whereas for pixels in the second and third rows and the same column, their signal charges are transferred in directions away from each other.

FIG. 3A illustrates an insulating isolation region 40 formed when semiconductor regions are separated by an insulator (insulating isolation). The insulating isolation region 40 of the present example has a shallow trench isolation (STI) structure in which the insulator is mostly embedded in the semiconductor substrate 100. The insulating isolation region 40 may have a local oxidation of silicon (LOCOS) structure. Alternatively, as described in Japanese Patent Laid-Open No. 2005-347325, an insulator may be mostly exposed from the front surface of the semiconductor substrate 100. In the present example, the insulating isolation region 40 is disposed between columns, and extends in the column direction. As illustrated in FIGS. 5A and 5B, a sixth semiconductor region 36 of second conductivity type is provided, as an interface shielding region, on the front surface of the semiconductor substrate 100 in contact with the insulator of the insulating isolation region 40.

FIG. 3B illustrates the second semiconductor regions 12 and 22 and the third semiconductor region 33, which are semiconductor regions of second conductivity type. For ease of positional comparison with FIG. 3A, the positions of gate electrodes on the front surface of the semiconductor substrate 100 are indicated by dotted lines in FIG. 3B.

As illustrated in FIG. 3B, the pixels $P_{12}$ and $P_{32}$ are class A pixels each having the second semiconductor region 12 located at a shallow level, and the pixels $P_{11}$, $P_{21}$, $P_{31}$, $P_{41}$, $P_{22}$, and $P_{42}$ are class B pixels each having the second semiconductor region 22 located at a deep level. As can be seen from FIG. 3B, the third semiconductor region 33 extends in a rectangular grid pattern along the row and column directions. The position of the third semiconductor region 33 is represented by a position indicating a peak impurity concentration of the second conductivity type in a planar direction within the continuous semiconductor region of second conductivity type. In FIG. 4A, a position indicating a peak impurity concentration is indicated by a dotted line, and the corresponding portion serves as a substantial potential barrier.

As can be seen by referring to both FIGS. 3A and 3B, the insulating isolation region 40 is provided between columns in the shallow part of the semiconductor substrate 100, and a junction isolation region is provided between columns in the deep part of the semiconductor substrate 100. In the present example, there is no insulating isolation region 40 between rows and only the junction isolation region is provided between rows. However, the configuration is not limited to this. That is, there may be the insulating isolation region 40 between rows, and the insulating isolation region 40 between columns may be omitted.

As illustrated in FIG. 4A, in the present example, all the second semiconductor regions 22 of the pixels $P_{11}$, $P_{21}$, $P_{31}$, $P_{41}$, $P_{22}$, and $P_{42}$, which are class B pixels, are provided at the same depth. However, the second semiconductor regions 22 of some of these pixels may be provided at a level deeper than that of the second semiconductor regions 22 of other pixels. For example, the second semiconductor regions 22 of the pixels $P_{21}$ and $P_{41}$ may be provided at a level deeper than that of the second semiconductor regions 22 of the pixels $P_{11}$, $P_{31}$, $P_{22}$, and $P_{42}$.

Figure 6A:
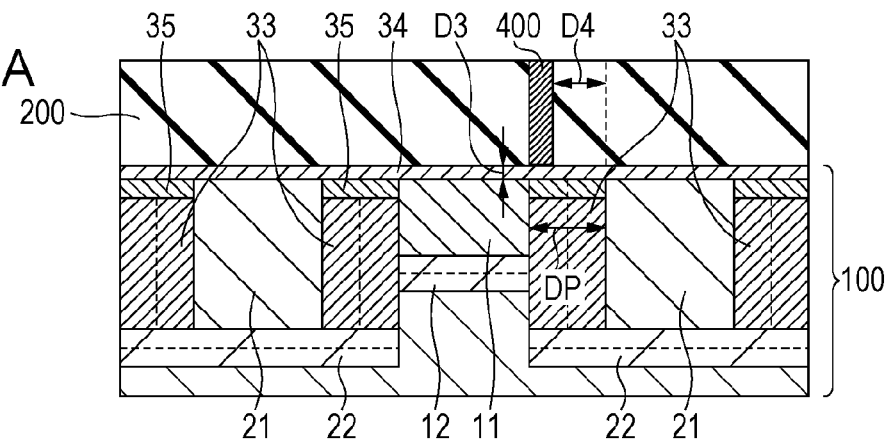
FIGS. 6A to 6D provide schematic cross-sectional views of the pixel portion.

As illustrated in FIG. 4A, a seventh semiconductor region 37 of first conductivity type is located deeper than the second semiconductor region 12 of each of the pixels $P_{12}$ and $P_{32}$. Below the seventh semiconductor region 37, there is a semiconductor region of second conductivity type contiguous to the second semiconductor regions 22 of the pixels $P_{22}$ and $P_{42}$ and located at the same depth as the second semiconductor regions 22 of the pixels $P_{22}$ and $P_{42}$. This semiconductor region does not form a PN junction with the first semiconductor region 11 of either of the pixels $P_{12}$ and $P_{32}$, and thus does not serve as the second semiconductor region of either of the pixels $P_{12}$ and $P_{32}$. As illustrated in FIG. 6A, such a semiconductor region of second conductivity type may be removed from the bottom of either of the pixels $P_{12}$ and $P_{32}$.

As illustrated in FIG. 5A, floating diffusion regions, source regions, and drain regions are disposed above the third semiconductor region 33. The fifth semiconductor region 35 serving as an intermediate region is disposed between the third semiconductor region 33 and the floating diffusion regions, the source regions, and the drain regions. As a potential barrier or a punch-through stopper, or for the purpose of setting a threshold, the fifth semiconductor region 35 is provided to adjust concentrations in channel regions, source regions, and drain regions of transistors. Although the conductivity type of, and the distribution of concentration in, the fifth semiconductor region 35 can be appropriately determined, typically most part of the fifth semiconductor region 35 is of second conductivity type. Even when the fifth semiconductor region 35 is of first conductivity type, the impurity concentration in the fifth semiconductor region 35 is lower than those in the first semiconductor regions 11 and 21, floating diffusion regions, source regions, and drain regions. At least part of the fifth semiconductor region 35 located between the third semiconductor region 33 and the fourth semiconductor region 34 may be of second conductivity type.

FIG. 3A illustrates positions of various contacts described with reference to FIG. 2. The gate plugs connected to the gate electrodes are disposed above the insulating isolation region 40. Each contact connected to the semiconductor substrate 100 is disposed above the third semiconductor region 33. The reference contacts 400 are electrically connected via the third semiconductor region 33 to the second semiconductor regions 12. Of the contacts connected to the semiconductor substrate 100, all contacts except the reference contacts 400 (i.e., connection contacts, supply contacts, and output contacts) are disposed above the junction isolation region. However, between the third semiconductor region 33 and these contacts, there are semiconductor regions of first conductivity type, such as source regions and drain regions. Therefore, all the contacts except the reference contacts 400 are electrically isolated from the third semiconductor region 33 and the second semiconductor regions 12. The connection contacts of the present example are formed by so-called shared contact plugs.

Each reference contact 400 is provided near at least two photoelectric conversion elements. Specifically, the reference contact 400 is located near the first semiconductor regions 11 and 21 of the photoelectric conversion elements 10 and 20, with the third semiconductor region 33, the fourth semiconductor region 34, and the fifth semiconductor region 35 interposed therebetween. Hereinafter, the photoelectric conversion elements 10 and 20 will be described as pixels, as they are major components of the pixels.

In the present example, a plurality of pixels are divided into two categories, neighboring pixels and non-neighboring pixels, depending on the positional relationship with the reference contact 400. The neighboring pixels are further divided into three categories, first-order neighboring pixels, second-order neighboring pixels, and third-order neighboring pixels. In the present example, the first-order neighboring pixels are class A pixels, and the second-order neighboring pixels are class B pixels. The third-order neighboring pixels are class B pixels, and the non-neighboring pixels include both class A pixels and class B pixels.

The first-order neighboring pixels are each a pixel that includes the first semiconductor region 11 closest to the reference contact 400. The second-order neighboring pixels are each a pixel that includes the first semiconductor region 21 second closest to the reference contact 400. The second-order neighboring pixel is a pixel adjacent to the first-order neighboring pixel. When a distance from the reference contact 400 to the first semiconductor region 11 of the first-order neighboring pixel is defined as a third distance D3 and a distance from the reference contact 400 to the first semiconductor region 21 of the second-order neighboring pixel is defined as a fourth distance D4, the third distance D3 is smaller than the fourth distance D4 (D3<D4). In FIG. 4A, the third distance D3 and the fourth distance D4 are each expressed as a distance in the planar direction, which is a substantial difference between them. In practice, in the depth direction of the semiconductor substrate 100, the thicknesses of the fourth semiconductor region 34 and the fifth semiconductor region 35 are also considered as these distances. The third distance D3 in the planar direction illustrated in FIG. 4A may be zero. In this case, as illustrated in FIG. 6A, the third distance D3 between the reference contact 400 and the first semiconductor region 11 depends on the thickness of the fourth semiconductor region 34. Of pixels adjacent to a first-order neighboring pixel, all pixels except a second-order neighboring pixel are third-order neighboring pixels. The third-order neighboring pixels each include the first semiconductor region 21 farther from the reference contact 400 than the first semiconductor region 21 of the second-order neighboring pixel is from the reference contact 400. A determination as to whether a pixel is either a neighboring pixel (one of first- to third-order neighboring pixels) or a non-neighboring pixel is to be made with reference to the reference contact 400 closest to the pixel. A non-neighboring pixel is a pixel not adjacent to a first-order neighboring pixel. When pixels adjacent to the pixel $P_{ij}$ are defined as pixels $P_{gh}$, the pixels $P_{gh}$ are all pixels that satisfy g=i−1, i, or i+1 and h=j−1, j, or j+1, except the pixel $P_{ij}$. In the present example, every pixel in the pixel portion 910, except those in the outermost part of the pixel portion 910, has eight adjacent pixels.

In the example of FIG. 3A, the reference contacts 400 are each disposed between the pixels $P_{32}$ and $P_{22}$. Thus, in the present example, the reference contacts 400 are disposed between the second and third rows. The pixels $P_{32}$ are first-order neighboring pixels, the pixels $P_{22}$ are second-order neighboring pixels, and the pixels $P_{21}$, $P_{31}$, $P_{41}$, and $P_{42}$ are third-order neighboring pixels. The pixels $P_{11}$ and $P_{12}$ are non-neighboring pixels.

In the present example, the reference contacts 400 are each disposed above the third semiconductor region 33. Since the third semiconductor region 33 is located between the first semiconductor regions 11 and 21 adjacent to each other, the reference contact 400 is located between the adjacent first semiconductor regions 11 and 21 in plan view. That is, of the two pixels having the adjacent first semiconductor regions 11 and 21 with the reference contact 400 therebetween, the one having the first semiconductor region 11 closer to the reference contact 400 is a first-order neighboring pixel, and the other having the first semiconductor region 21 farther from the reference contact 400 is a second-order neighboring pixel.

In the present example, each reference contact 400 is disposed in a space between rows, the space not being provided with the insulating isolation region 40. However, the reference contact 400 may be disposed between columns. For example, the reference contact 400 may be provided between the pixels $P_{32}$ and $P_{31}$. In this case, the distance between the reference contact 400 and the pixel $P_{32}$ may be smaller than the distance between the reference contact 400 and the pixel $P_{31}$. Although the pixels $P_{21}$ and $P_{31}$ are in the second and third rows, no reference contact 400 is provided between them.

Figure 6B:
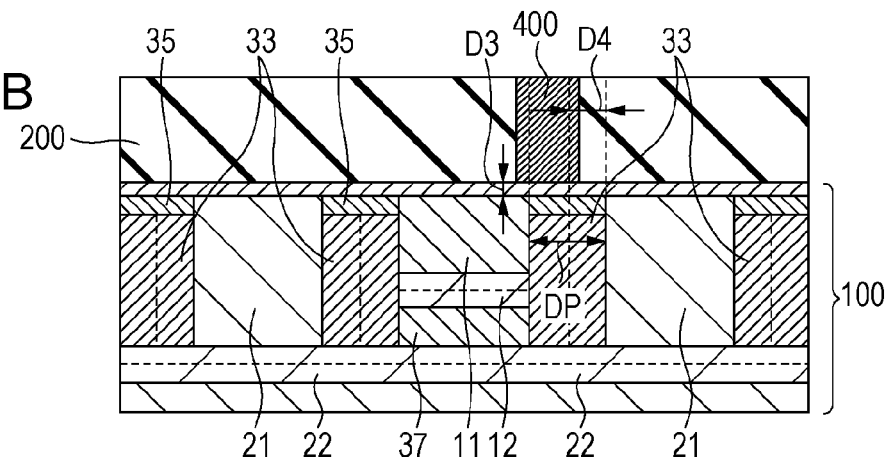
Figure 6C:
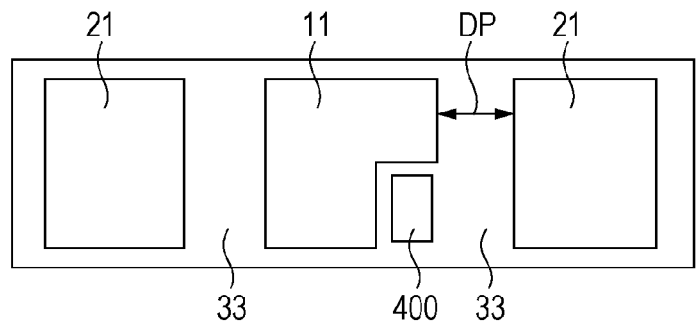

As illustrated in FIG. 6B, a part of the reference contact 400 may be located above the first semiconductor region 11. In this case, again, the third distance D3 between the reference contact 400 and the first semiconductor region 11 depends on the thickness of the fourth semiconductor region 34. Although the reference contact 400 may be provided only directly above the first semiconductor region 11, this may be avoided because this may reduce the amount of light received, increase the level of noise, and increase resistance to the second semiconductor region 12. Also as illustrated in FIG. 6B, the reference contact 400 may be partially located on one side of the potential barrier of the third semiconductor region 33 closer to the first semiconductor region 21. However, this may be avoided as much as possible, because this may increase the level of noise in the class B pixel. The fourth distance D4 may be greater than DP/2, where DP is a distance between the first semiconductor region 11 of the first-order neighboring pixel and the first semiconductor region 21 of the second-order neighboring pixel. A diameter of the reference contact 400 may be smaller than DP/2. The distance DP may be 1.0 μm or less. FIG. 6C is a schematic plan view of a modification. As illustrated, the first semiconductor region 11 of the class A pixel may be reduced in size to accommodate the reference contact 400.

Open circles in FIG. 1A roughly indicate the positions of the reference contacts 400 in the pixel portion 910. As can be seen from FIG. 1A, the number of reference contacts 400 in the pixel portion 910 can be smaller than the number of pixels in the pixel portion 910. Image quality can be improved if the number of reference contacts 400 in the light-receiving pixel section 911 is smaller than the number of pixels in the light-receiving pixel section 911. In FIG. 1A, one reference contact 400 is provided for every eight pixels in the pixel portion 910. The number of the reference contacts 400 in the pixel portion 910 is 55, which is less than ¼ of the total of 414 pixels. The number of the reference contacts 400 in the pixel portion 910 may be less than ¼, less than or equal to ⅛, or even less than or equal to 1/16 of the number of pixels in the pixel portion 910. For example, one reference contact 400 may be provided for every 100 to 10000 pixels. For example, one reference contact 400 can apply a reference potential to all pixels present in an area of 100 μm² to 10000 μm². The greater the number of reference contacts 400, the more it is possible to reduce shading. Although the reference contacts 400 are arranged in a rectangular lattice in the present example, they may be arranged in an orthorhombic lattice, hexagonal lattice, or square lattice.

To make the structure of the light-shielding pixel section 912 as similar as possible to that of the light-receiving pixel section 911, the density of the reference contacts 400 (i.e., the number of the reference contacts 400 per area) in the light-shielding pixel section 912 may be brought closer to that in the light-receiving pixel section 911. That is, the number of the reference contacts 400 in the light-shielding pixel section 912 may also be smaller than the number of pixels in the light-shielding pixel section 912. To achieve uniform characteristics of pixels, the reference contacts 400 may be arranged periodically.

Although not shown in FIG. 1A, the second semiconductor regions 12 extend from the pixel portion 910 to the intermediate portion 920, where there are also reference contacts 400 electrically connected to the second semiconductor regions 12. The number of the reference contacts 400 in the intermediate portion 920 is 86, which is greater than the number of the reference contacts 400 in the pixel portion 910.

The number of the reference contacts 400 in the intermediate portion 920 may be greater than the number of the reference contacts 400 in the pixel portion 910. The density of the reference contacts 400 in the intermediate portion 920 may be greater than the density of the reference contacts 400 in the pixel portion 910. Note that the density is a value obtained by dividing the number of the reference contacts 400 in the pixel portion 910 or the intermediate portion 920 by the area of the pixel portion 910 or the intermediate portion 920. By providing a large number of reference contacts 400 in the intermediate portion 920, it is possible to achieve a stable or uniform potential distribution in the pixel portion 910.

In the present example, a plurality of pixels are divided into three categories, long-wavelength pixels, medium-wavelength pixels, and short-wavelength pixels. The long-wavelength pixels, medium-wavelength pixels, and short-wavelength pixels are different in the main transmission wavelength of color filters. A first wavelength which is a main transmission wavelength of a color filter of a long-wavelength pixel is longer than a second wavelength which is a main transmission wavelength of a color filter of a medium-wavelength pixel. A third wavelength which is a main transmission wavelength of a color filter of a short-wavelength pixel is longer than the second wavelength. In FIGS. 3A and 3B, main transmitted light that has passed through a color filter of each pixel is indicated by R, G, or B depending on the wavelength. For example, long-wavelength light R is red light having the longest wavelength, medium-wavelength light G is green light having the second longest wavelength, and short-wavelength light B is blue light having the shortest wavelength. In the present example, the pixels $P_{21}$ and $P_{41}$ are long-wavelength pixels each having a red light filter. The pixels $P_{11}$, $P_{31}$, $P_{22}$, and $P_{42}$ are medium-wavelength pixels each having a green light filter. The pixels $P_{12}$ and $P_{32}$ are short-wavelength pixels each having a blue light filter. In the present example, an array of color filters has a Bayer pattern.

As described above, the plurality of pixels P in the pixel portion 910 are categorized in accordance with some criteria. The plurality of pixels P can be divided into four categories, class I pixels, class II pixels, class III pixels, and class IV pixels in accordance with a combination of criteria. Specifically, a pixel which is a class A pixel and first-order neighboring pixel is categorized as a class I pixel, a pixel which is a class B pixel and second-order neighboring pixel is categorized as a class II pixel, a pixel which is a long-wavelength pixel is categorized as a class III pixel, a pixel which is a class A pixel and non-neighboring pixel is categorized as a class IV pixel. Also, the plurality of pixels P can be divided into four categories, type I pixels, type II pixels, type III pixels, and type IV pixels in accordance with a combination of other criteria. Specifically, a pixel which is a class A pixel and short-wavelength pixel is categorized as a type I pixel, a pixel which is a medium-wavelength pixel is categorized as a type II pixel or a type IV pixel, and a pixel which is a class B pixel and long-wavelength pixel is categorized as a type III pixel.

Figure 1B:
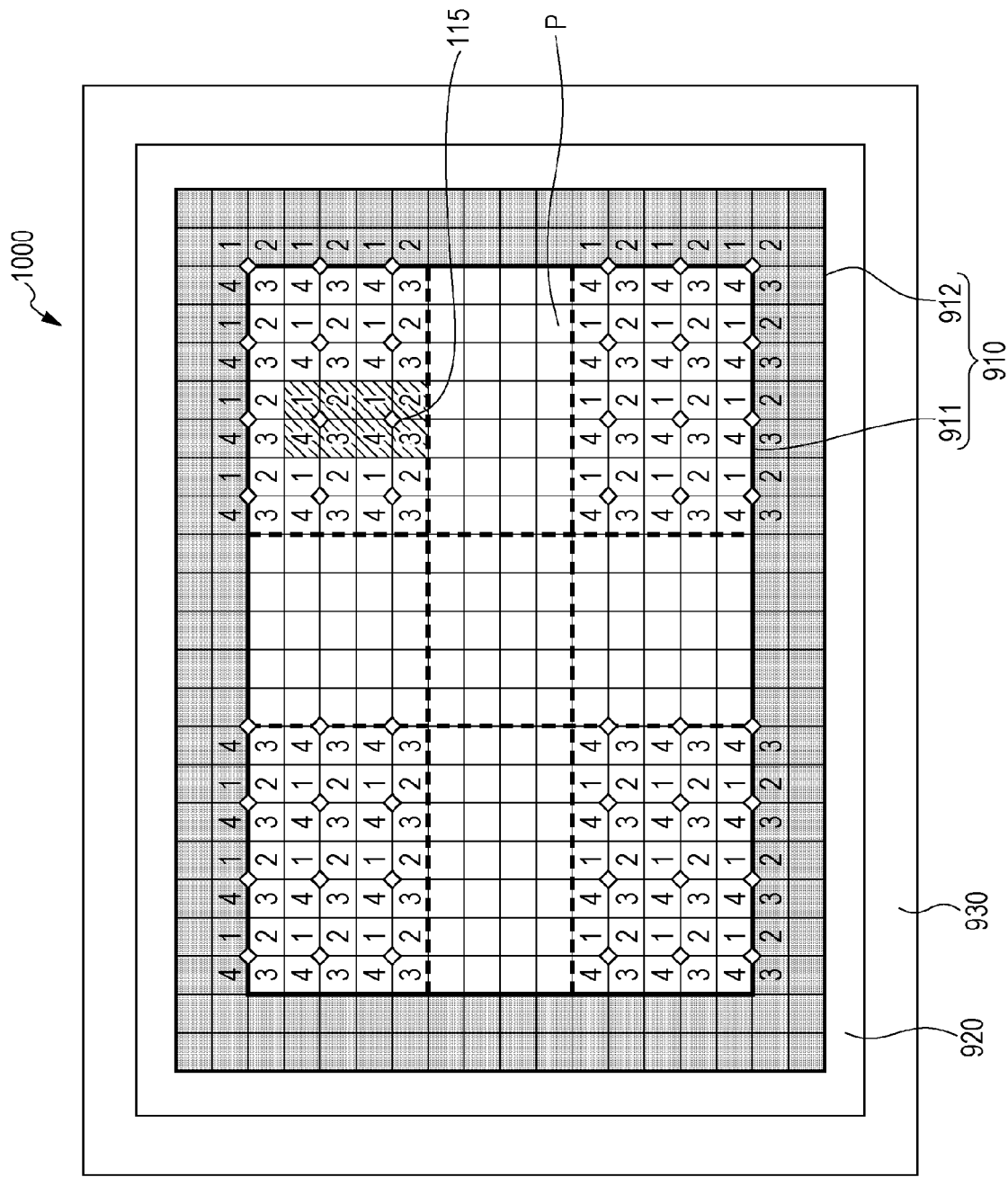

In FIG. 1A, class I pixels are indicated by "1", class II pixels are indicated by "2", class III pixels are indicated by "3", and class IV pixels are indicated by "4". In FIG. 1B, type I pixels are indicated by "1", type II pixels are indicated by "2", type III pixels are indicated by "3", and type IV pixels are indicated by "4". Pixels without numbers may be any of class I to IV pixels, any of type I to IV pixels, or pixels of other kinds, such as pixels used specifically for focus detection and not designed for image pickup purposes.

The type II and IV pixels are common in that both are medium-wavelength pixels, but are different in the following ways. The type II pixels are in the same column as the type I pixels, whereas the type IV pixels are in the same column as the type III pixels. A type II pixel may belong to the same pixel group as a type I pixel, whereas a type IV pixel may belong to the same pixel group as a type III pixel. There is no insulating isolation region 40 between the photoelectric conversion element 20 of the type II pixel and the photoelectric conversion element 10 of the type I pixel, whereas there is the insulating isolation region 40 between the photoelectric conversion element 20 of the type IV pixel and the photoelectric conversion element 10 of the type I pixel. There is the insulating isolation region 40 between the photoelectric conversion element 20 of the type II pixel and the photoelectric conversion element 10 of the type III pixel, whereas there is no insulating isolation region 40 between the photoelectric conversion element 20 of the type IV pixel and the photoelectric conversion element 20 of the type III pixel.

One pixel can be both one of the class I to IV pixels and one of the type I to IV pixels at the same time. For example, the pixel $P_{32}$ is both a class I pixel and a type I pixel. The pixel $P_{22}$ is both a class II pixel and a type II pixel. The pixel $P_{21}$ is both a class III pixel and a type III pixel. The pixel $P_{12}$ is both a class IV pixel and a type I pixel.

In a second-order neighboring pixel, a dark current originating from the reference contact 400 can be smaller than that in a first-order neighboring pixel. A potential barrier formed in the third semiconductor region 33 can serve as a divide for a noise charge originating from the reference contact 400. Therefore, the amount of noise charge originating from the reference contact 400 may vary from one pixel to another, depending on the position of the reference contact 400 with respect to the divide. The reference contact 400 is located on one side of the divide closer to the first-order neighboring pixel. This may be the reason for which a noise charge originating from the reference contact 400 is less easily accumulated in the second-order neighboring pixel than in the first-order neighboring pixel.

In a class A pixel, a dark current generated in a deep part of the semiconductor substrate 100 is smaller than that in a class B pixel. Potential barriers formed in the second semiconductor regions 12 and 22 can serve as divides for a noise charge generated in the deep part of the semiconductor substrate 100. Therefore, the amount of noise charge generated in the deep part of the semiconductor substrate 100 may vary depending on the depth of the divide in the semiconductor substrate 100. The divide formed in the second semiconductor region 12 of the class A pixel is located at a shallower level than the divide formed in the second semiconductor region 22 of the class B pixel. This may be the reason for which a noise charge generated in the deep part of the semiconductor substrate 100 is less easily accumulated in the class A pixel than in the class B pixel.

The class A pixel is characterized in that its dynamic range is lower than that of the class B pixel. Therefore, if the second semiconductor regions of all pixels are located at a shallow level as those of the class A pixels, the dynamic range of the entire image pickup apparatus 1000 is degraded. In the present example, where only some of the pixels are class A pixels, it is possible to prevent significant degradation of the dynamic range of the entire image pickup apparatus 1000.

Thus, in the image pickup apparatus 1000 of the present example, a difference in noise level between a class I pixel and a class II pixel can be reduced. In the present example, the pixel $P_{32}$ which is a first-order neighboring pixel is a class A pixel at the same time. Thus, a part of dark current in the pixel $P_{32}$, the part being generated in the deep part of the semiconductor substrate 100, is reduced. The pixel $P_{22}$ which is a class B pixel located near a reference contact 400 is a second-order neighboring pixel at the same time. Thus, a part of dark current in the pixel $P_{22}$, the part originating from the reference contact 400, is reduced. It is thus possible to avoid the situation where the amount of dark current in one of the first-order neighboring pixel and the second-order neighboring pixel is much greater than that in the other.

When the directions of transfer in adjacent pixels are opposite with respect to a reference contact 400, it is possible to reduce superposition of dark current originating from the reference contact 400 on a signal. When adjacent pixels are connected to different amplifying transistors, it is possible to reduce a significant increase of dark current in a specific amplifying transistor.

Figure 6D:
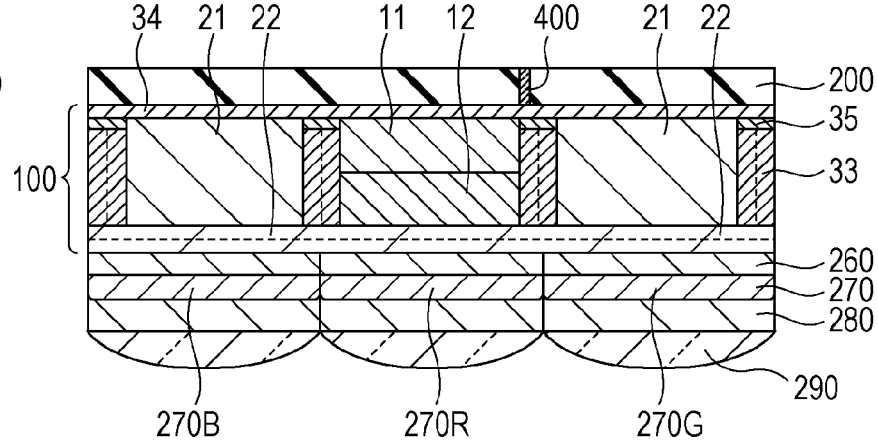

When the front surface of the semiconductor substrate 100 where the reference contacts 400 are provided is a light receiving surface, the main transmission wavelength of the color filters of the class A pixels may be shorter than that of the color filters of the class B pixels. This is because since silicon absorbs more short-wavelength visible light than long-wavelength visible light, the class B pixels are advantageous over the class A pixels in collecting signal charges generated by long-wavelength light. Conversely, when the back surface, which is opposite the front surface of the semiconductor substrate 100 where the reference contacts 400 are provided, is a light receiving surface, the main transmission wavelength of the color filters of the class B pixels may be shorter than that of the color filters of the class A pixels. FIG. 6D is a schematic cross-sectional view of a configuration where color filters and microlenses are disposed on the back surface side of the semiconductor substrate 100. For example, a pixel having the second semiconductor region 12 shallow from the front surface of the semiconductor substrate 100 includes a red color filter 270R, whereas a pixel having the second semiconductor region 22 deep from the front surface of the semiconductor substrate 100 includes a green color filter 270G or a blue color filter 270B.

FIG. 4B schematically illustrates optical paths of the long-wavelength light R, medium-wavelength light G, and short-wavelength light B. The image pickup system 2000 includes a non-telecentric optical system or an object-side telecentric optical system as the optical system 1010. In this case, the angle of incidence on the light receiving surface increases radially from the center toward the outer edge of the light-receiving pixel section 911. Specifically, the angle of incidence on the light receiving surface of the image pickup apparatus 1000 is nearly zero in the vicinity of the center of the light-receiving pixel section 911, and increases with an increasing distance from the center of the light-receiving pixel section 911. For example, the light-receiving pixel section 911 can be divided into nine areas in a three-by-three matrix. The nine areas will be referred to as a center area, an upper-right area, a right area, a lower-right area, a lower area, a lower-left area, a left area, and an upper-left area. In FIG. 1B, these areas are separated by dotted lines. For example, in FIG. 1B, in the upper-right area of the light-receiving pixel section 911, light is incident toward the upper right of the drawing, whereas in the lower-left area of the light-receiving pixel section 911, light is incident toward the lower left of the drawing. Referring to FIG. 4B, which illustrates a cross section including a direction from the center to the outer edge (along line IVB-IVB of FIG. 3A) in the upper-right area partially hatched in FIG. 1B, light beams are incident at angles as illustrated in FIG. 4B. Light beams (R, G, and B) incident through the insulating film 200 on the upper surface of the semiconductor substrate 100 or on the upper surfaces of the transfer gate electrodes of the transfer gates 115 and 113 are refracted to reduce the angles with respect to the light receiving surface. On the other hand, light beams (R', G', and B') incident on the side faces of the transfer gate electrodes of the transfer gates 115 and 113 are refracted to increase the angles with respect to the light receiving surface. This is because the refractive index (e.g., 4.0) of the transfer gate electrodes, which are made of polysilicon, of the transfer gates 115 and 113 is higher than the refractive index (e.g., 1.4 to 2.3) of the insulating film 200. Color mixture occurs if such light beams incident on the side faces of the transfer gate electrodes of the transfer gates 115 and 113 become stray light beams and are photoelectrically converted in other pixels. Light having a wavelength which is not easily absorbed by the semiconductor substrate 100 tends to become stray light, which is a significant cause of color mixture. Since silicon does not easily absorb long-wavelength light, such as red light, light incident on the side face of the transfer gate electrode of the transfer gate 115 of a pixel including a red optical filter tends to become stray light. The same applies to the transfer gate 117. If dissipation of incident light is reduced by providing the optical waveguide 210 as illustrated in FIG. 10B, stray light caused by the above-described factor becomes prominent. In particular, when the optical waveguide 210 extends to a position facing the side face of the polysilicon gate electrode 110 as illustrated in FIG. 10B, light leaking from the optical waveguide 210 is easily incident on the side face of the polysilicon gate electrode 110. In the present example, a transfer gate electrode of a long-wavelength pixel is disposed in an upper-right part of the first semiconductor region 21 of the pixel as illustrated in FIG. 3A. Therefore, in the light-receiving pixel section 911, light incident at an angle in the upper-right area of FIG. 1B is easily incident on a side face of the transfer gate electrode adjacent to the photoelectric conversion element. As a result, the occurrence of color mixture is prominent in the upper-right area of the light-receiving pixel section 911. In a Bayer pattern, where a long-wavelength pixel and a short-wavelength pixel are arranged in an oblique direction, red stray light from the long-wavelength pixel is detected by the short-wavelength pixel originally designed to detect blue light. Therefore, a blue color may be emphasized in a part of the resulting image corresponding to the upper-right area of the light-receiving pixel section 911. In the present example, since pixel groups each having the layout of FIGS. 3A and 3B are arranged in a translational symmetrical manner over the entire light-receiving pixel section 911, light is not easily incident on side faces of transfer gate electrodes in the upper-left, lower-left, and lower-right areas in FIG. 1B. Therefore, the intensity of blue color in the part of the image corresponding to the upper-right area of the light-receiving pixel section 911 is more prominent than that in other parts of the image corresponding to the upper-left, lower-left, and lower-right areas of the light-receiving pixel section 911. When pixel areas each having the layout of FIGS. 3A and 3B are arranged in a rotational symmetrical manner about the center of the light-receiving pixel section 911, a generally bluish image may be obtained.

Although a transfer gate electrode of a long-wavelength pixel is disposed in the upper-right part of the pixel in the example described above, a similar problem may occur when a transfer gate electrode of the long-wavelength pixel is disposed in the right part of the pixel. When color filters are arranged in a Bayer pattern, there is a medium-wavelength pixel to the immediate right of the transfer gate electrode of the long-wavelength pixel. Therefore, in the right area of the light-receiving pixel section 911, red light causes color mixture in the medium-wavelength pixels, so that the intensity of green color is prominent in a part of the resulting image corresponding to the right area of the light-receiving pixel section 911. Thus, a phenomenon occurs in which a color in a part of a captured image corresponding to a specific area of the light-receiving pixel section 911, which is an image pickup unit, is different from a color in other parts of the captured image corresponding to other areas of the light-receiving pixel section 911.

In the present example, as described above, color mixture caused by long-wavelength light incident on the transfer gate electrode of the transfer gate 115 of the long-wavelength pixel can be reduced by appropriately determining the position of the transfer gate electrode and the depth of the second semiconductor region 12. That is, the transfer gate electrode of the long-wavelength pixel is positioned such that a part of the side face of the transfer gate electrode on which long-wavelength light is to be incident is located between the photoelectric conversion element 20 of the long-wavelength pixel and the photoelectric conversion element 10 of the class A pixel. Thus, light incident on the transfer gate electrode of the long-wavelength pixel is guided to a place below the photoelectric conversion element 10 of the class A pixel. Specifically, as described above, the transfer gate electrode of the transfer gate 115 of the long-wavelength pixel is disposed above a region between the first semiconductor region 21 of the pixel $P_{41}$ which is a long-wavelength pixel and the first semiconductor region 11 of the pixel $P_{32}$ which is a class A pixel. In at least one or more areas of the light-receiving pixel section 911, the photoelectric conversion element 20 (first semiconductor region 21) of the pixel $P_{41}$ and the photoelectric conversion element 10 (first semiconductor region 11) of the pixel $P_{32}$ are arranged in this order from the center toward the outer edge of the light-receiving pixel section 911. The transfer gate 115 of the pixel $P_{41}$ is disposed between the photoelectric conversion element 20 of the pixel $P_{41}$ and the photoelectric conversion element 10 of the pixel $P_{32}$. In the present example, this order of arrangement is possible in the upper-right area of the light-receiving pixel section 911. In the present example, the class A pixel is located in the direction of transfer of the long-wavelength pixel. Typically, a straight line connecting the optical center in the light receiving surface of the long-wavelength pixel and the optical center in the light receiving surface of the class A pixel passes through the transfer gate of the long-wavelength pixel. Referring to FIG. 1B, open diamonds represent the transfer gates of the long-wavelength pixels. Although only one open diamond is marked with reference numeral 115 in FIG. 1B, each open diamond represents the transfer gate 115 or 117 illustrated in FIG. 2.

In a class A pixel, when a semiconductor region of first conductivity type or a semiconductor region of second conductivity type thinner than the second semiconductor region 12 is present below the second semiconductor region 12, the second semiconductor region 12 serves as a potential barrier for such a semiconductor region. Therefore, even when photoelectric conversion caused by stray light occurs in the region below the second semiconductor region 12, color mixture in this class A pixel can be reduced. In this example, color mixture caused by stray light from the pixel $P_{41}$, which is a class III pixel and type III pixel, is reduced by the pixel $P_{32}$, which is a class I pixel and type I pixel. Thus, it is possible to use the shallowness of the second semiconductor region 12 of the pixel $P_{32}$, which is a first-order neighboring pixel for the reference contact 400. However, regardless of the reference contact 400, the pixel $P_{12}$, which is a type IV pixel, can reduce color mixture caused by stray light from the pixel $P_{21}$, which is a type III pixel. Thus, providing a class A pixel is effective even when the pixel is a non-neighboring pixel. When the transfer gate electrode of the long-wavelength pixel is disposed in the right part of the pixel as described above, the effect of color mixture can be reduced when the medium-wavelength pixel is a class A pixel at the same time. However, the resulting loss of efficiency in photoelectric conversion is greater in the medium-wavelength pixel where a larger amount of light reaches the deep part of the semiconductor substrate 100 than that in the short-wavelength pixel. When the short-wavelength pixel, not the medium-wavelength pixel, is a class A pixel, the loss of efficiency in photoelectric conversion can be smaller than that in the case where the medium-wavelength pixel is a class A pixel. The insulating isolation region 40 including an insulator and embedded deep below the front surface of the semiconductor substrate 100 can reflect stray light in the semiconductor substrate 100, because of a difference in refractive index between the semiconductor and the insulator. Therefore, by providing the insulating isolation region 40 (STI) between the long-wavelength pixel and the short-wavelength pixel, it is possible to reduce the occurrence of color mixture in the semiconductor substrate 100.

A method for manufacturing the image pickup apparatus 1000 will now be described. FIGS. 7A to 7C and FIGS. 8D to 8F illustrate a cross section corresponding to FIG. 5A for describing a method for manufacturing an image pickup apparatus.

(Step A)

Figure 7A:
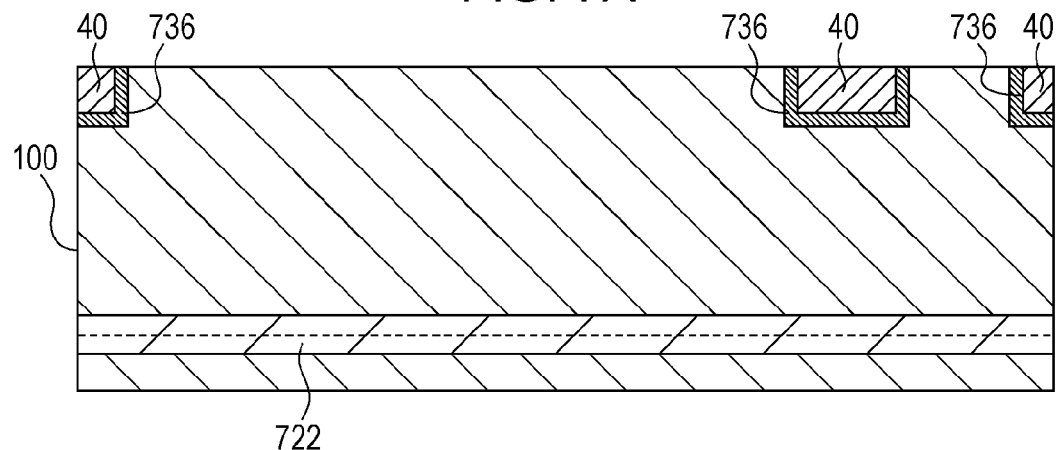
FIGS. 7A to 7C provide schematic cross-sectional views illustrating a method for manufacturing the image pickup apparatus.

Step A will be described with reference to FIG. 7A. A semiconductor layer of first conductivity type formed by epitaxial deposition on a semiconductor base of second conductivity type can be used as the semiconductor substrate 100. This semiconductor layer (epitaxial layer) of first conductivity type substantially serves as the semiconductor substrate 100. Trenches are formed in a shallow part of the semiconductor substrate 100, and an impurity layer 736 of second conductivity type serving as the sixth semiconductor region 36 is formed on the inner surfaces of the trenches. The impurity layer 736 can be formed, for example, with an implantation energy of 10 KeV to 50 KeV and a dosage of $1\times10^{13}$ to $5\times10^{13}$ (ions/cm$^2$). Then, an insulator is embedded in the trenches to form the insulating isolation region 40. Next, an impurity layer 722 of second conductivity type serving as the second semiconductor regions 22 in the class B pixels P2 is formed in a deep part of the semiconductor substrate 100 (i.e., in a deep part of the epitaxial layer). The impurity layer 722 can be formed, for example, with an implantation energy of 2 MeV to 4 MeV and a dosage of $1\times10^{11}$ to $1\times10^{12}$ (ions/cm$^2$).

(Step B)

Figure 7B:
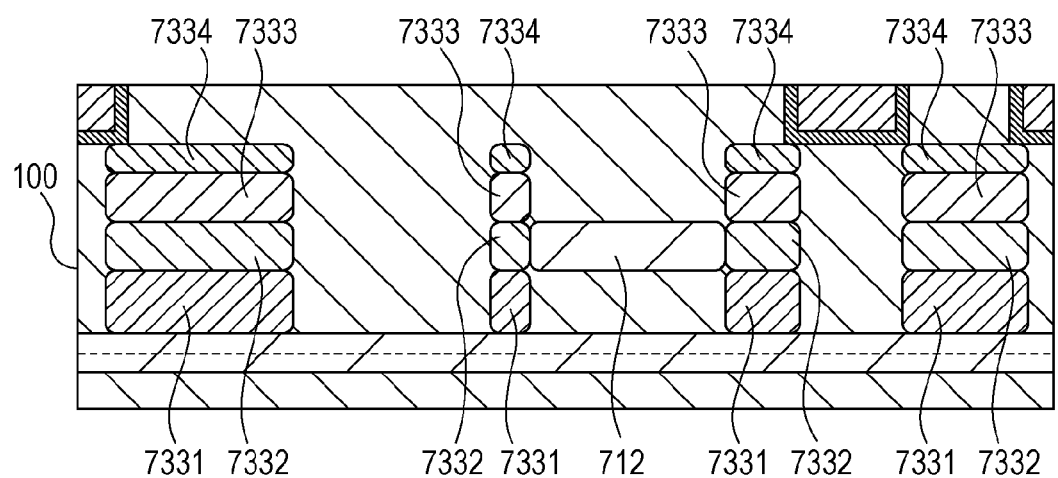

Step B will be described with reference to FIG. 7B. Impurity layers 7331 to 7334 of second conductivity type serving as the third semiconductor region 33 are formed in the deep part of the semiconductor substrate 100. Any of the impurity layers 7331 to 7334 can be formed with a dosage of $1\times10^{11}$ to $1\times10^{12}$ (ions/cm$^2$). The impurity layers 7331 and 7332 can be formed, for example, with an implantation energy of 0.75 MeV to 2.0 MeV, and the impurity layers 7333 and 7334 can be formed, for example, with an implantation energy of 0.25 MeV to 0.75 MeV.

An impurity layer 712 of second conductivity type serving as the second semiconductor regions 12 is formed in the deep part of the semiconductor substrate 100. The impurity layer 712 can be formed, for example, with an implantation energy of 0.75 MeV to 2.0 MeV and a dosage of $1\times10^{11}$ to $1\times10^{12}$ (ions/cm$^2$). The impurity layer 712 and the impurity layer 7332 are located at substantially the same depth. The impurity layer 712 and the impurity layer 7332 may be formed to be stacked. The dosage for the impurity layer 712 may be higher than that for the impurity layer 7332. The dosage for the impurity layer 7332 may be lower than that for at least one of the impurity layer 7331 and the impurity layer 7333. In the present example, the impurity layers 7331, 7332, 7333, and 7334 are formed with the same masks, and the impurity layer 712 is formed with a mask different from those for the impurity layers 7331, 7332, 7333, and 7334. The impurity layers 7331, 7333, and 7334 may be formed with the same masks, and the impurity layer 712 and the impurity layer 7332 may be formed with a single mask.

(Step C)

Figure 7C:
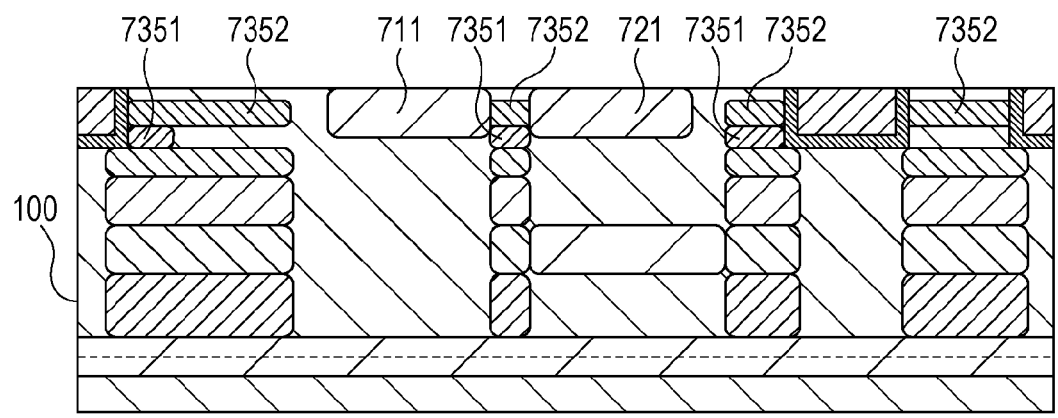

Step C will be described with reference to FIG. 7C. Impurity layers 7351 and 7352 of second conductivity type serving as the fifth semiconductor region 35 are formed in the shallow part of the semiconductor substrate 100. In the present example, the impurity layer 7351 is formed between rows and is not formed between columns. The impurity layer 7352 is formed between rows and columns. The impurity layers 7351 and 7352 can be formed, for example, with an implantation energy of 50 KeV to 500 KeV and a dosage of $1\times10^{11}$ to $1\times10^{13}$ (ions/cm$^2$). Impurity layers 711 and 721 of first conductivity type serving as the first semiconductor regions 11 and 21 are formed in the shallow part of the semiconductor substrate 100. The impurity layers 711 and 721 can be formed, for example, with an implantation energy of 10 KeV to 500 KeV and a dosage of $1\times10^{11}$ to $1\times10^{13}$ (ions/cm$^2$). As described above, the first semiconductor region 21 can extend deeper than the first semiconductor region 11 does. However, the impurity layers 711 and 721 can be formed under the same conditions and at the same time. In this case, the concentration of the semiconductor substrate 100 (epitaxial layer) is dominant in a part of the first semiconductor region 21 deeper than the first semiconductor region 11. That is, the conductivity type and the concentration profile of the region below each of the impurity layers 711 and 721 are dominantly determined by whether the epitaxial layer is counter-doped by the impurity layer 712.

(Step D)

Step D will be described with reference to FIG. 8D. After a gate insulating film is formed on the semiconductor substrate 100, a polysilicon film is deposited. Impurities of first conductivity type are implanted into part of the polysilicon film corresponding to n-channel metal-oxide semiconductor (NMOS) transistors in the pixel portion 910 and the peripheral portion 930, and impurities of second conductivity type are implanted into part of the polysilicon film corresponding to p-channel metal-oxide semiconductor (PMOS) transistors in the peripheral portion 930. The polysilicon film is patterned with an appropriate mask to form gate electrodes 810. The impurities can be introduced into the polysilicon film, for example, with an implantation energy of 1 KeV to 50 KeV and a dosage of $1\times10^{14}$ to $1\times10^{16}$ (ions/cm$^2$).

(Step E)

Step E will be described with reference to FIG. 8E. An impurity layer 723 of first conductivity type serving as floating diffusion regions and source and drain regions of amplifying transistors are formed in the shallow part of the semiconductor substrate 100. The impurity layer 723 can be formed, for example, with an implantation energy of 1 KeV to 50 KeV and a dosage of $1\times10^{12}$ to $1\times10^{14}$ (ions/cm$^2$).

An impurity layer 734 of second conductivity type serving as the fourth semiconductor region 34 is formed in the shallow part of the semiconductor substrate 100. The impurity layer 734 can be formed, for example, with an implantation energy of 1 KeV to 50 KeV and a dosage of $1\times10^{12}$ to $1\times10^{14}$ (ions/cm$^2$). While impurities are being introduced into the semiconductor substrate 100 in the steps described above, the semiconductor substrate 100 is heated with appropriate timing. By the heating, impurities in each impurity layer are diffused within the semiconductor substrate 100, so that an appropriate distribution of impurity concentration in the semiconductor region can be achieved.

(Step F)

Step F will be described with reference to FIG. 8F. An appropriate surface insulating layer (not shown) and an interlayer insulating layer 201 are formed on the semiconductor substrate 100. Contact holes 203 are formed in the interlayer insulating layer 201. Impurities are introduced into the semiconductor substrate 100 through the contact holes 203. This is to reduce contact resistance. Impurities of second conductivity type are introduced into parts to serve as the reference contacts 400, and at least impurities of first conductivity type are introduced into parts to serve as the supply contacts, output contacts, and connection contacts. Impurities of first conductivity type and impurities of second conductivity type can be formed, for example, with an implantation energy of 1 KeV to 100 KeV and a dosage of $1\times10^{14}$ to $1\times10^{16}$ (ions/cm$^2$).

The dosage of impurities of second conductivity type for the reference contacts 400 may be higher than the dosage of impurities of first conductivity type for the supply contacts and output contacts. For example, the dosage of impurities of second conductivity type may be 5 to 20 times the dosage of impurities of first conductivity type. Contact plugs are formed by tungsten chemical mechanical polishing (W-CMP).

Further steps are performed to realize, for example, the image pickup apparatus 1000 having the pixels illustrated in FIGS. 10A and 10B. After a wiring step for copper or aluminum wiring is performed to form the insulating film 200, openings are formed in the insulating film 200. A material having a refractive index higher than that of the insulating film 200, such as silicon nitride, is embedded in the openings to form the optical waveguide 210. For forming the openings, a silicon nitride layer formed before the interlayer insulating layer 201 is formed may be used as an etching stopper. The silicon nitride layer may form the optical waveguide 210 together with a high refractive index material, such as silicon nitride embedded in the openings. When the silicon nitride layer serving as an etching stopper covers a side face of the polysilicon gate electrode 110 of a transfer gate, the optical waveguide 210 extends to a position facing the side face of the polysilicon gate electrode 110 of the transfer gate. After the optical waveguide 210 is formed, the second lens 250, the color filter 270, and the first lens 290 are sequentially formed to obtain the image pickup apparatus 1000.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-178277 filed Aug. 10, 2012 and No. 2012-178278 filed Aug. 10, 2012, which are hereby incorporated by reference herein in their entirety.

What is claimed is:

1. An image pickup apparatus comprising:
a pixel portion in which pixels are arranged, the pixels each including a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between the second semiconductor region and a surface of a semiconductor substrate,
wherein the first semiconductor regions of two adjacent pixels are separated by a third semiconductor region of second conductivity type, the second semiconductor regions of the two adjacent pixels are electrically connected to the third semiconductor region, and a reference contact that applies a reference potential via the third semiconductor region to the second semiconductor regions is provided on the surface of the semiconductor substrate;
wherein the number of reference contacts in the pixel portion is less than a quarter of the number of the pixels in the pixel portion;
wherein the pixel portion includes a class I pixel and a class II pixel located near each reference contact, and a distance between the surface and the second semiconductor region of the class I pixel is smaller than a distance between the surface and the second semiconductor region of the class II pixel; and
wherein a distance between the reference contact and the first semiconductor region of the class I pixel is smaller than a distance between the reference contact and the first semiconductor region of the class II pixel.

2. The image pickup apparatus according to claim 1, wherein the pixel portion includes a first amplifying transistor that generates an electric signal based on a signal charge of the class I pixel, and a second amplifying transistor that generates an electric signal based on a signal charge of the class II pixel.

3. The image pickup apparatus according to claim 2, wherein the first amplifying transistor generates an electric signal based on signal charges of pixels in a first pixel group including the class I pixel, the second amplifying transistor generates an electric signal based on signal charges of pixels in a second pixel group including the class II pixel, the pixels in the first pixel group are connected to a first floating diffusion region, and the pixels in the second pixel group are connected to a second floating diffusion region.

4. The image pickup apparatus according to claim 2, wherein a distance between the reference contact and a first output contact that outputs the electric signal from the first amplifying transistor is smaller than a distance between the reference contact and a second output contact that outputs the electric signal from the second amplifying transistor.

5. The image pickup apparatus according to claim 2, wherein the pixel portion includes a first reset transistor that resets the signal charge of the class I pixel and a second reset transistor that resets the signal charge of the class II pixel, and the first amplifying transistor and the second reset transistor are connected to a common contact.

6. The image pickup apparatus according to claim 1, wherein the reference contact is disposed above a part of the third semiconductor region, the part being located between the first semiconductor region of the class I pixel and the first semiconductor region of the class II pixel.

7. The image pickup apparatus according to claim 1, wherein no insulator is provided between the first semiconductor region of the class I pixel and the first semiconductor region of the class II pixel.

8. The image pickup apparatus according to claim 1, wherein each of the pixels has a transfer gate that transfer a signal charge, and in a direction in which the first semiconductor region of the class I pixel and the first semiconductor region of the class II pixel are arranged, a transfer direction of the transfer gate of the class I pixel is opposite a transfer direction of the transfer gate of the class II pixel.

9. The image pickup apparatus according to claim 1, wherein the pixel portion includes a class III pixel; the class I pixel includes a color filter whose main transmission wavelength is a first wavelength, the color filter being disposed on the surface side of the semiconductor substrate; the class II pixel includes a color filter whose main transmission wavelength is a second wavelength longer than the first wavelength, the color filter being disposed on the surface side of the semiconductor substrate; and the class III pixel includes a color filter whose main transmission wavelength is a third wavelength longer than the second wavelength, the color filter being disposed on the surface side of the semiconductor substrate.

10. The image pickup apparatus according to claim 9, wherein each of the pixels includes a transfer gate that has a polysilicon gate electrode and transfers a signal charge, and in at least part of the pixel portion, the first semiconductor region of the class III pixel, the transfer gate of the class III pixel, and the first semiconductor region of the class I pixel are arranged in this order from a center toward an outer edge of the pixel portion.

11. An image pickup apparatus comprising:
an image pickup unit in which pixels are arranged, the pixels each including
a photoelectric conversion element including a first semiconductor region of first conductivity type having signal charges as majority carriers and a second semiconductor region of second conductivity type having signal charges as minority carriers, the second semiconductor region being contiguous to the first semiconductor region, the first semiconductor region being disposed between the second semiconductor region and a surface of a semiconductor substrate, and
a transfer gate including a polysilicon gate electrode on the surface side of the semiconductor substrate, the transfer gate being configured to transfer a signal charge,
wherein the image pickup unit includes a type I pixel including a color filter whose main transmission wavelength is a first wavelength, the color filter being disposed on the surface side of the semiconductor substrate; a type II pixel including a color filter whose main transmission wavelength is a second wavelength different from the first wavelength, the color filter being disposed on the surface side of the semiconductor substrate; and a type III pixel including a color filter whose main transmission wavelength is a third wavelength longer than the first wavelength and the second wavelength, the color filter being disposed on the surface side of the semiconductor substrate;
wherein a distance between the surface and the second semiconductor region of the type I pixel is smaller than a distance between the surface and the second semiconductor region of the type III pixel; and
wherein in at least part of the image pickup unit, the photoelectric conversion element of the type III pixel and the photoelectric conversion element of the type I pixel are arranged in this order from a center toward an outer edge of the image pickup unit, and the transfer gate of the type III pixel is disposed between the photoelectric conversion element of the type III pixel and the photoelectric conversion element of the type I pixel.

12. The image pickup apparatus according to claim 11, wherein the transfer gate of the type I pixel is configured to transfer a signal charge in a direction in which the photoelectric conversion element of the type I pixel and the photoelectric conversion element of the type III pixel are arranged.

13. The image pickup apparatus according to claim 11, wherein the second wavelength is longer than the first wavelength.

14. The image pickup apparatus according to claim 11, wherein a distance between the surface and the second semiconductor region of the type I pixel is smaller than a distance between the surface and the second semiconductor region of the type II pixel.

15. The image pickup apparatus according to claim 11, wherein an optical waveguide is provided on the surface side of the semiconductor substrate.

16. The image pickup apparatus according to claim 11, wherein an insulator is provided between the first semiconductor region of the type I pixel and the first semiconductor region of the type III pixel.

17. The image pickup apparatus according to claim 11, wherein no insulator is provided between the first semiconductor region of the type I pixel and the first semiconductor region of the type II pixel.

18. The image pickup apparatus according to claim 11, wherein the image pickup unit includes a first amplifying transistor that generates an electric signal based on a signal charge of the type I pixel, and a second amplifying transistor that generates an electric signal based on a signal charge of the type III pixel.

19. An image pickup system comprising:
the image pickup apparatus according to claim 1; and
a display unit configured to display an image obtained by the image pickup apparatus.

20. An image pickup system comprising:
the image pickup apparatus according to claim 11; and
a non-telecentric optical system or an object-side telecentric optical system.

* * * * *